(12) United States Patent
Aoki et al.

(10) Patent No.: US 12,058,841 B2
(45) Date of Patent: Aug. 6, 2024

(54) COOLING DEVICE AND COOLING SYSTEM USING COOLING DEVICE

(71) Applicant: Furukawa Electric Co., Ltd., Tokyo (JP)

(72) Inventors: Hirofumi Aoki, Tokyo (JP); Yoshikatsu Inagaki, Tokyo (JP); Yoshinori Nakamura, Tokyo (JP); Hideaki Kawabata, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 318 days.

(21) Appl. No.: 17/508,689

(22) Filed: Oct. 22, 2021

(65) Prior Publication Data

US 2022/0046824 A1 Feb. 10, 2022

Related U.S. Application Data

(63) Continuation of application No. PCT/JP2020/018775, filed on May 11, 2020.

(30) Foreign Application Priority Data

Sep. 10, 2019 (JP) ................................. 2019-164963

(51) Int. Cl.
*G06F 1/16* (2006.01)
*F28D 15/04* (2006.01)
(Continued)

(52) U.S. Cl.
CPC ......... *H05K 7/20318* (2013.01); *F28D 15/04* (2013.01); *H05K 7/20327* (2013.01)

(58) Field of Classification Search
CPC .......... H05K 7/20318; H05K 7/20327; H05K 7/20336
See application file for complete search history.

(56) References Cited

U.S. PATENT DOCUMENTS 7,077,189 B1 * 7/2006 Reyzin ................. H01L 23/473
165/83
7,796,389 B2 * 9/2010 Edmunds ............ F28D 15/0233
361/679.52
(Continued)

FOREIGN PATENT DOCUMENTS

| CN | 1482430 A | 3/2004 |
|---|---|---|
| CN | 106197109 A | 12/2016 |

(Continued)

OTHER PUBLICATIONS

[English Translation] 1st Office Action dated Jan. 12, 2021 for TW Application No. 109130743.
(Continued)

*Primary Examiner* — Anthony M Haughton
(74) *Attorney, Agent, or Firm* — Dorsey & Whitney LLP

(57) ABSTRACT

A cooling device that can reduce heat resistance by improving a heat exchange action of a condensation tube, and can exhibit excellent cooling characteristics, and a cooling system using the cooling device are provided. The cooling device includes a container to which at least one heating element is thermally connected, a primary refrigerant sealed inside the container, a condensation tube through which a secondary refrigerant flows and which penetrates through a gaseous phase portion inside the container, and a porous member provided at an outer surface of the condensation tube.

24 Claims, 13 Drawing Sheets

(51) Int. Cl.
*H05K 5/00* (2006.01)
*H05K 7/00* (2006.01)
*H05K 7/20* (2006.01)

(56) References Cited

U.S. PATENT DOCUMENTS

| | | | |
|---|---|---|---|
| 8,014,150 B2* | 9/2011 | Campbell | H05K 7/20809 |
| | | | 165/185 |
| 8,059,405 B2* | 11/2011 | Campbell | F28F 3/02 |
| | | | 361/679.53 |
| 10,744,603 B2* | 8/2020 | Machler | F28F 3/048 |
| 11,044,835 B2* | 6/2021 | Chiu | H05K 7/20309 |
| 2005/0274496 A1 | 12/2005 | Ishii et al. | |
| 2006/0185828 A1* | 8/2006 | Takehara | F28D 15/0233 |
| | | | 165/45 |
| 2011/0138849 A1* | 6/2011 | Hirano | F28D 15/0266 |
| | | | 62/513 |
| 2012/0175094 A1* | 7/2012 | Rice | F28F 3/12 |
| | | | 165/170 |
| 2013/0105122 A1 | 5/2013 | Campbell et al. | |
| 2016/0073548 A1 | 3/2016 | Wei et al. | |
| 2018/0084673 A1 | 3/2018 | Asai et al. | |
| 2022/0057144 A1* | 2/2022 | Nakashima | H05K 7/20336 |
| 2022/0418160 A1* | 12/2022 | Chen | H05K 7/208 |

FOREIGN PATENT DOCUMENTS

| | | |
|---|---|---|
| CN | 206247927 U | 6/2017 |
| JP | S5461346 A | 5/1979 |
| JP | H0632409 B2 | 4/1994 |
| JP | 2000121264 A | 4/2000 |
| JP | 2005268658 A | 9/2005 |
| JP | 2008227150 A | 9/2008 |
| JP | 2009150575 A | 7/2009 |
| JP | 2012247166 A | 12/2012 |
| JP | 2015197245 A | 11/2015 |
| JP | 2016054248 A | 4/2016 |
| JP | 2019116990 A | 7/2019 |
| WO | 2016151805 A1 | 9/2016 |
| WO | 2021049096 A1 | 3/2021 |

OTHER PUBLICATIONS

International Search Report and Written Opinion [English Translation for ISR Only] for PCT Application No. PCT/JP2020/018775, mailed Jul. 14, 2020.
[English Translation] Notification of the Second Office Action dated Feb. 17, 2022 for Chinese Patent Application No. 202090000281.X; pp. all.
[English Translation] First Office Action issued Oct. 21, 2021 for Chinese Application No. 202090000281.X.
[English Translation] Notice of Reasons for Refusal mailed on Nov. 17, 2021 for Japanese Application No. 2019-164963.

* cited by examiner

COOLING DEVICE AND COOLING SYSTEM USING COOLING DEVICE

CROSS REFERENCE TO RELATED APPLICATIONS

The present application is a continuation application of International Patent Application No. PCT/JP2020/018775 filed on May 11, 2020, which claims the benefit of Japanese Patent Application No. 2019-164963, filed on Sep. 10, 2019. The contents of these applications are incorporated herein by reference in their entire y.

BACKGROUND

Technical Field

The present disclosure relates to a cooling device that cools electric/electronic components and the like, and particularly relates to a cooling device that can reduce heat resistance of an inside of the cooling device.

Background

With the advancement of functions of electronic devices, heating elements such as electric/electronic components are mounted at high density inside the electronic devices, and the heat generation amount of the heating elements is increasing. If the temperature of the heating element such as electric/electronic components rises above the predetermined allowable temperature, it becomes the cause of malfunctioning of the electric/electronic components and the like, and therefore it is important to keep the temperature of the heating elements such as electric/electronic components at the allowable temperature or less. Therefore, a cooling device for cooling electric/electronic components and the like at the allowable temperature or less is mounted inside the electronic device.

Therefore, as the cooling device that stably cools electric/electronic components and the like in which the amount of heat generation is increased, there has been proposed a boiling cooling device including a liquid container unit having a heating element mounted to a mounting surface, and having a heat transfer wall which a liquid refrigerant contacts, on an inner surface facing the mounting surface, and a condensation unit that connects to the liquid container unit and condenses the refrigerant that boils to be gas by heat of the heating element (Japanese Patent Application Laid-open No. 2009-150575). In Japanese Patent Application Laid-open No. 2009-150575, a condensation pipe unit penetrates through the condensation unit, and the refrigerant flows through the inside of the condensation pipe unit.

However, in Japanese Patent Application Laid-open No. 2009-150575, the outer surface of the condensation pipe unit is smooth, and therefore, the heat exchange action via the wall surface of the condensation pipe unit has a disadvantage when condensing the refrigerant that boils and becomes gas. In addition, the refrigerant which changes in phase to a liquid phase adheres to the outer surface of the condensation pipe unit, and the heat exchange action of the condensation pipe unit is hindered.

In order to improve the heat exchange action via the wall surface of the condensation tube such as a condensation tube unit, increasing the surface area of the outer surface of the condensation tube is proposed. As the unit configured to increase the surface area of the outer surface of the condensation tube, recessed and protruded portions may be provided on the outer surface of the condensation tube, for example. However, if the surface area of the outer surface of the condensation tube is increased by the recessed and protruded portions or the like on the outer surface of the condensation tube, the refrigerant that changes in phase to the liquid phase is more likely to adhere, and there is a room for improvement in the heat exchange action of the condensation tube.

SUMMARY

The present disclosure is related to providing a cooling device that can reduce heat resistance by improving a heat exchange action of a condensation tube, and exhibit excellent cooling characteristics, and a cooling system using the cooling device.

A gist of a cooling device and a cooling system using the cooling device is as follows.

[1] A cooling device including a container to which at least one heating element is thermally connected, a primary refrigerant sealed in an inside of the container, a condensation tube through which a secondary refrigerant flows, and which penetrates through a gaseous phase portion in the inside of the container, and a porous member provided at an outer surface of the condensation tube.

[2] The cooling device described in [1], wherein a condensation tube outer surface area increasing portion configured to increase a contact area with the primary refrigerant in a gaseous phase is formed on the outer surface of the condensation tube.

[3] The cooling device described in [1] or [2], wherein the porous member is provided at a lower side in a gravity direction from a center line in an orthogonal direction to the gravity direction in a section in a width direction of the condensation tube, of the outer surface of the condensation tube.

[4] The cooling device described in any one of [1] to [3], wherein the porous member is provided at a bottom portion of the condensation tube that faces a liquid level of the primary refrigerant in a liquid phase stored in the inside of the container.

[5] The cooling device described in any one of [1] to [4], wherein the porous member includes an extension portion extended along a gravity direction.

[6] The cooling device described in any one of to [5], wherein the porous member is a sheet-shaped member.

[7] The cooling device described in any one of [1] to [6], wherein the porous member is a metal mesh.

[8] The cooling device described in any one of [1] to [7], wherein the porous member is in contact with the outer surface of the condensation tube.

[9] The cooling device according to any one of [1] to [8], wherein the porous member extends along a longitudinal direction of the condensation tube.

[10] The cooling device described in [2], wherein the condensation tube outer surface area increasing portion is a plurality of fins.

[11] The cooling device described in any one of [1] to [10], wherein a condensation tube inner surface area increasing portion configured to increase a contact area with the secondary refrigerant is formed on an inner surface of the condensation tube.

[12] The cooling device described in any one of [1] to [11], wherein a plurality of the condensation tubes each provided with the porous member are disposed in parallel.

[13] The cooling device according to any one of [1] to [12], wherein a plurality of the condensation tubes each provided with the porous member are disposed in layers.

[14] The cooling device according to any one of [1] to [13], wherein a secondary refrigerant storing block in which the secondary refrigerant is stored is further provided in the condensation tube, and the secondary refrigerant storing block is thermally connected to the container.

[15] The cooling device described in any one of [1] to [14], wherein the heating element is thermally connected to a part where the primary refrigerant in a liquid phase exists or a vicinity of the part where the primary refrigerant in a liquid phase exists, on an outer surface of the container.

[16] The cooling device described in any one of [1] to [15], wherein a container inner surface area increasing portion that increases a contact area with the primary refrigerant in a liquid phase is formed on an inner surface of the container to which the heating element is thermally connected.

[17] The cooling device described in [16], wherein the container inner surface area increasing portion is immersed in the primary refrigerant in a liquid phase.

[18] The cooling device described in [16] or [17], wherein the container inner surface area increasing portion is a plate-shaped fin, a pin fin and/or a dent.

[19] The cooling device described in any one of [16] to [18], wherein the container inner surface area increasing portion includes a thermal conductive member.

[20] The cooling device described in [19], wherein the thermal conductive member is a metal member or a carbon member.

[21] The cooling device described in any one of [16] to [20], wherein at least a part of the container inner surface area increasing portion is a sintered body of a thermalconductive material or an aggregate of a particulate thermal conductive material.

[22] The cooling device described in [21], wherein the sintered body of the thermal conductive material is a metal sintered body, and the metal sintered body is a sintered body of at least one kind of metal material selected from a group including metal powder, metal fiber, metal mesh, metal braid and metal foil.

[23] The cooling device described in [21], wherein the aggregate of the particulate thermal conductive material is an aggregate of carbon particles.

[24] A cooling system in which a cooling device including a container to which at least one heating dement is thermally connected, a primary refrigerant sealed in an inside of the container, a condensation tube through which a secondary refrigerant flows, and which penetrates through a gaseous phase portion in the inside of the container, and a porous member provided at an outer surface of the condensation tube, and a secondary refrigerant cooling portion to which the condensation tube extending from the cooling device is connected are used, and the secondary refrigerant circulates in the cooling device and the secondary refrigerant cooling portion, wherein in the inside of the container thermally connected to the heating element, the primary refrigerant receiving heat from the heating element changes in phase to a gaseous phase from a liquid phase, the primary refrigerant in the gaseous phase changes in phase to a liquid phase from the gaseous phase by a heat exchange action of the condensation tube, whereby heat is transferred to the secondary refrigerant flowing through the condensation tube from the primary refrigerant, and the secondary refrigerant to which the heat is transferred flows through the condensation tube to the secondary refrigerant cooling portion to be cooled to a predetermined temperature, and the secondary refrigerant cooled in the secondary refrigerant cooling portion flows through the condensation tube to return to the cooling device.

In an aspect of the above described [1], while the primary refrigerant that changes in phase from the gaseous phase to the liquid phase by the heat exchange action of the condensation tube adheres to the outer surface of the condensation tube, the primary refrigerant in the liquid phase adhering to the outer surface of the condensation tube flows to the porous member from the outer surface of the condensation tube by a capillary force of the porous member provided at the outer surface of the condensation tube. Thereby, it is possible to prevent the primary refrigerant in the liquid phase from adhering to the outer surface of the condensation tube.

In an aspect of the above described [3], the porous member is provided at the lower side in the gravity direction from the center line in the orthogonal direction to the gravity direction in the section in the width direction of the condensation tube, of the outer surface of the condensation tube, and is not provided at the upper side in the gravity direction from the center line.

According to an aspect of the cooling device of the present disclosure, the primary refrigerant sealed in the inside of the container, the condensation tube through which the secondary refrigerant flows, and which penetrates through the gaseous phase portion in the inside of the container, and the porous member provided at the outer surface of the condensation tube are included, whereby it is possible to prevent the primary refrigerant in the liquid phase from adhering to the outer surface of the condensation tube, so that the heat exchange action of the condensation tube is improved, the heat resistance of the cooling device is reduced, and as a result, it is possible to exhibit excellent cooling characteristics.

According to an aspect of the cooling device of the present disclosure, even when the condensation tube outer surface area increasing portion configured to increases the contact area with the primary refrigerant in the gaseous phase is formed on the outer surface of the condensation tube to improve the heat exchange action of the condensation tube, that is, to promote phase change from the gaseous phase to the liquid phase of the primary refrigerant, it is possible to prevent the primary refrigerant in the liquid phase from being held by the outer surface of the condensation tube by surface tension or the like of the condensation tube outer surface area increasing portion, by a capillary force of the porous member.

According to an aspect of the cooling device of the present disclosure, the porous member is provided at the lower side in the gravity direction from the center line in the orthogonal direction to the gravity direction in the section in the width direction of the condensation tube, whereby the primary refrigerant in the liquid phase is smoothly removed from the outer surface of the condensation tube, and is smoothly returned to the primary refrigerant in the liquid phase stored in the inside of the container from the porous member by the action of gravity while preventing inhibition of the heat exchange action of the condensation tube by the porous member itself.

According to an aspect of the cooling device of the present disclosure, the porous member includes the extension portion extended along the gravity direction, whereby the primary refrigerant in the liquid phase is more smoothly returned to the primary refrigerant in the liquid phase stored in the inside of the container from the porous member by the action of gravity.

According to an aspect of the cooling device of the present disclosure, the porous member is in contact with the outer surface of the condensation tube, whereby the primary refrigerant in the liquid phase can quickly flows to the porous member from the outer surface of the condensation tube.

According to an aspect of the cooling device of the present disclosure, the condensation tube inner surface area increasing portion that increases the contact area with the secondary refrigerant is formed on the inner surface of the condensation tube, whereby the heat exchange action of the condensation tube is improved, and heat transfer from the primary refrigerant to the secondary refrigerant is more promoted.

According to an aspect of the cooling device of the present disclosure, the container inner surface area increasing portion that increases the contact area with the primary refrigerant in a liquid phase is formed on the inner surface of the container to which the heating element is thermally connected, and thereby heat transfer to the primary refrigerant from the heating element through the container is made smooth.

Accordingly, phase change of the primary refrigerant to a gaseous phase from a liquid phase is promoted, and cooling characteristics are more improved.

According to an aspect of the cooling device of the present disclosure, at least a part of the container inner surface area increasing portion is a sintered body of a thermal conductive material or an aggregate of a particulate thermal conductive material, and thereby the porous portion is formed in the container inner surface area increasing portion, so that phase change of the primary refrigerant to a gaseous phase from a liquid phase is further promoted, and cooling characteristics are further improved.

DETAILED DESCRIPTION

Figure 1:
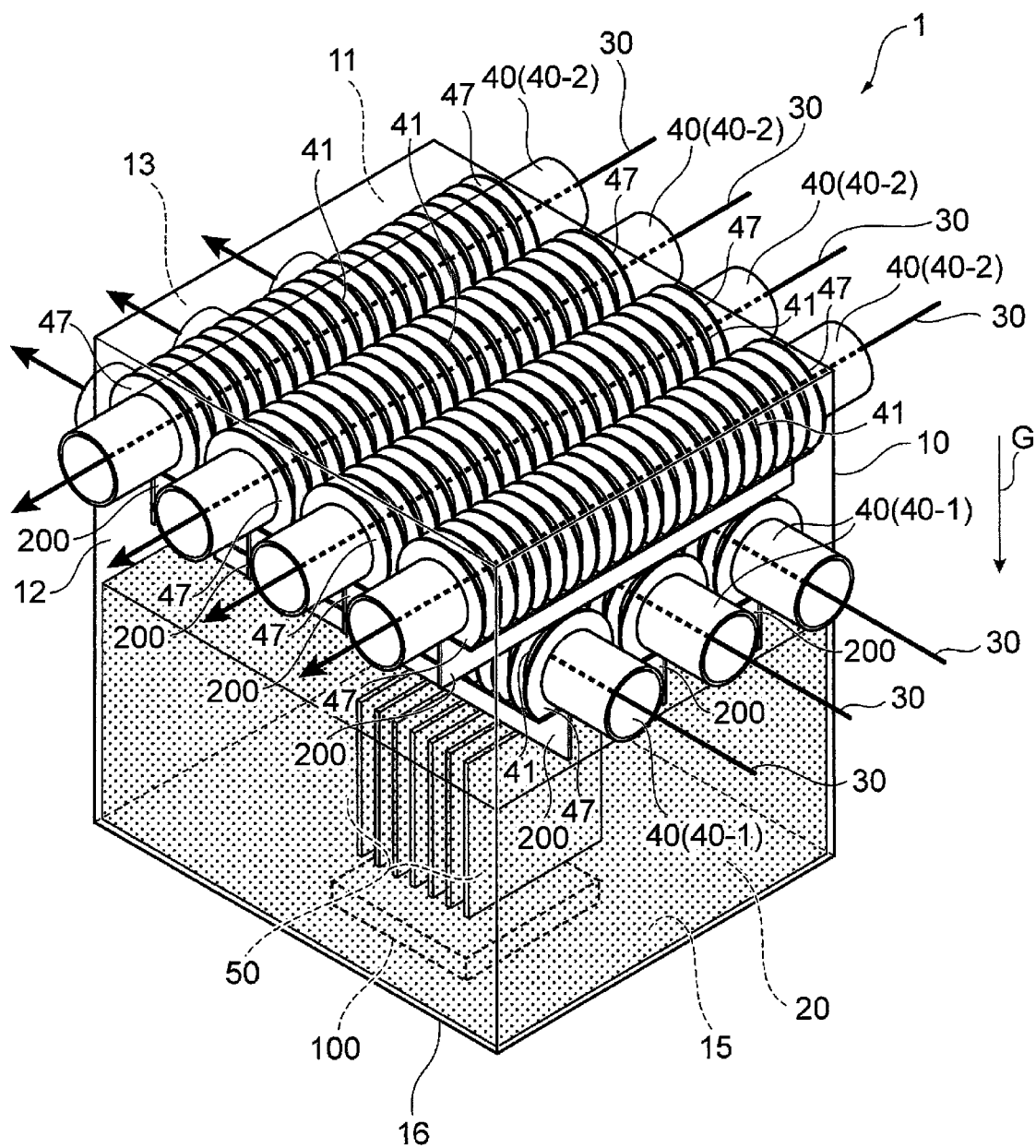
FIG. 1 is a perspective view explaining an outline of a cooling device according to a first embodiment of the present disclosure.
Figure 2:
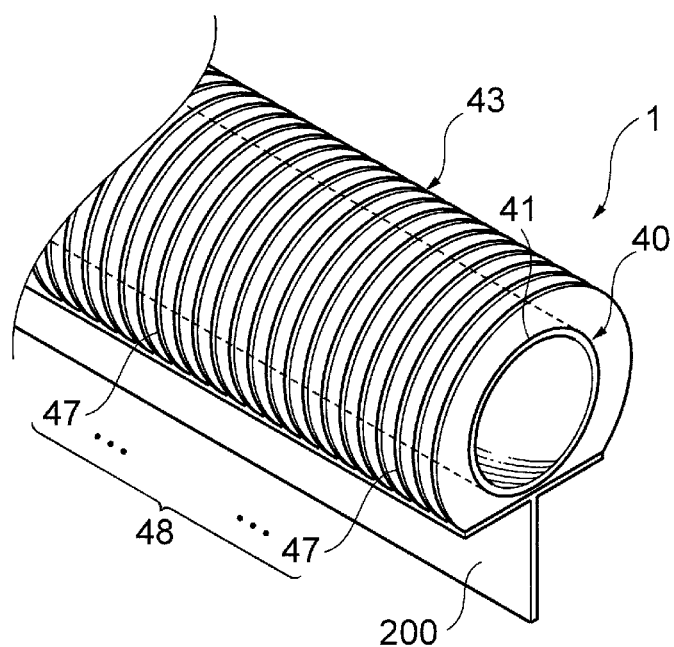
FIG. 2 is a perspective view of a part of a condensation tube provided in the cooling device according to the first embodiment of the present disclosure.
Figure 3A:
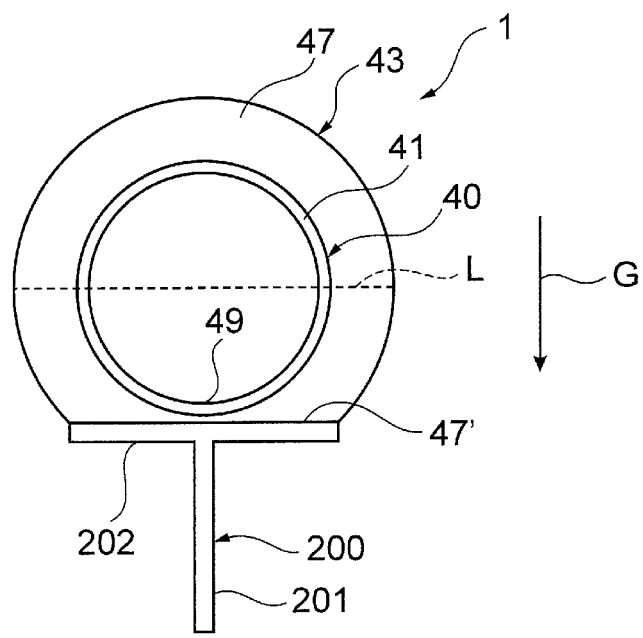
FIG. 3A is a front view of the part of the condensation tube provided in the cooling device according to the first embodiment of the present disclosure.
Figure 3B:
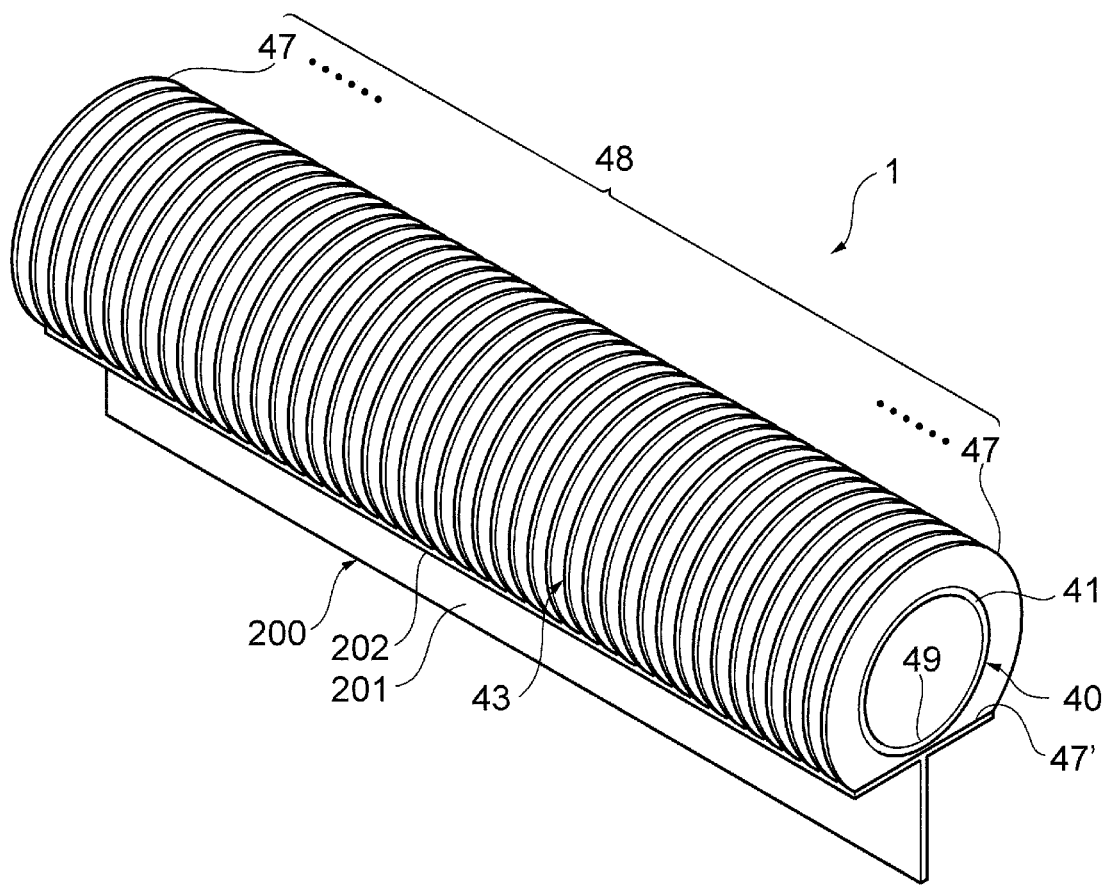
FIG. 3B is a perspective view of the part of the condensation tube provided in the cooling device according to the first embodiment of the present disclosure.
Figure 4:
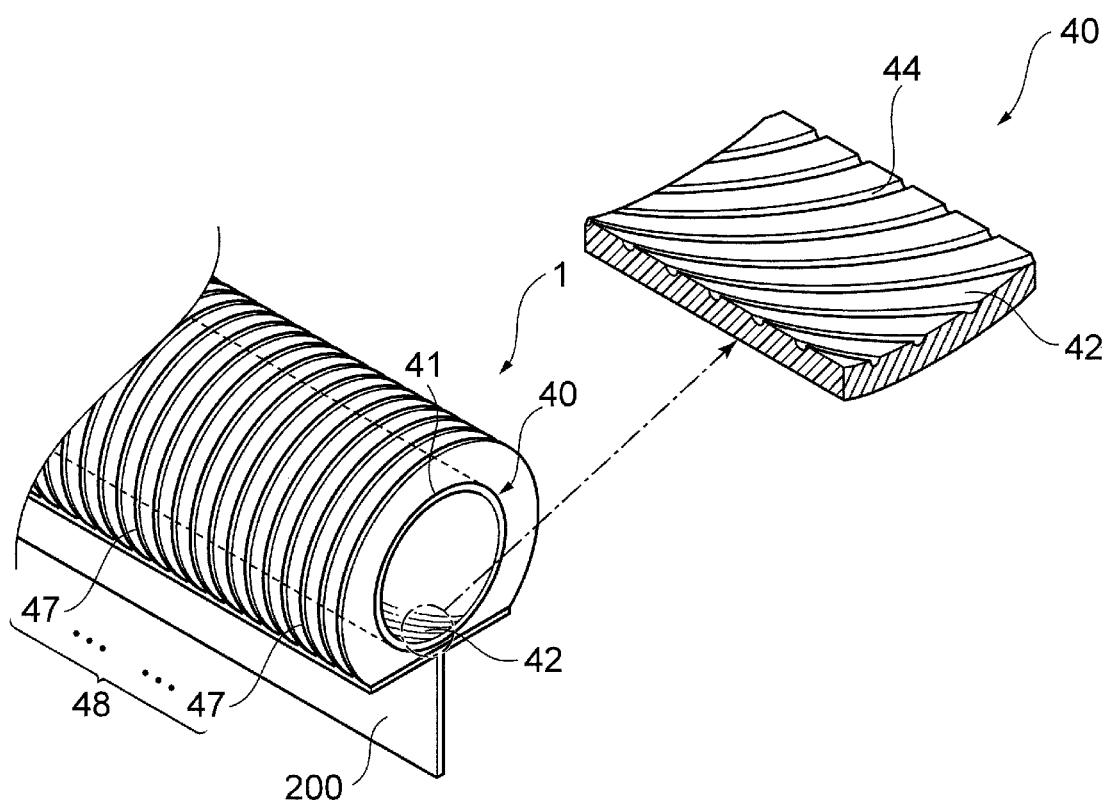
FIG. 4 is an explanatory view in which an inner surface of the condensation tube provided in the cooling device according to the first embodiment of the present disclosure is enlarged.

Hereinafter, cooling devices according to embodiments of the present disclosure will be described with use of the drawings. First, a cooling device according to a first embodiment of the present disclosure will be described. Note that FIG. 1 is a perspective view explaining an outline of the cooling device according to the first embodiment of the present disclosure. FIG. 2 is a perspective view of a part of a condensation tube provided in the cooling device according to the first embodiment of the present disclosure. FIG. 3A is a front view of the part of the condensation tube provided in the cooling device according to the first embodiment of the present disclosure, and FIG. 3B is a perspective view of the part of the condensation tube provided in the cooling device according to the first embodiment of the present disclosure. FIG. 4 is an explanatory view in which an inner surface of the condensation tube provided in the cooling device according to the first embodiment of the present disclosure is enlarged.

As illustrated in FIG. 1, a cooling device 1 according to the first embodiment of the present disclosure includes a container 10, a primary refrigerant 20 that is sealed in an inside of the container 10, a condensation tube 40 which penetrates through a gaseous phase portion 11 in the inside of the container 10, and through which a secondary refrigerant 30 flows, and a porous member 200 provided at an outer surface 41 of the condensation tube 40. A heating element 100 that is an object to be cooled is thermally connected to an outer surface 12 of the container 10, and thereby the heating element 100 is cooled.

A hollow cavity portion 13 is formed in the inside of the container 10. The cavity portion 13 is a space sealed to an external environment, and is depressurized by degassing. A shape of the container 10 is not specially limited, and is a rectangular parallelepiped in the cooling device 1.

As illustrated in FIG. 1, in the cavity portion 13, a predetermined amount of the primary refrigerant 20 in a liquid phase is stored. The primary refrigerant 20 in the liquid phase is stored in such a volume that the gaseous phase portion 11 can be formed in the inside of the container 10. The primary refrigerant 20 in a liquid phase exists at a lower side in the gravity direction, of the cavity portion 13, and the gaseous phase portion 11 in which the primary refrigerant 20 in the liquid phase is not stored is formed at an upper side in the gravity direction of the cavity portion 13. A connection position of the heating element 100 is not specially limited, but in the cooling device 1, the heating element 100 is thermally connected to a part where the primary refrigerant 20 in a liquid phase exists, on the outer surface 12 of the container 10, and more specifically, the heating element 100 is thermally connected to a bottom surface 16 of the container 10. By adopting the above described part as the connection position of the heating element 100 to the container 10, heat transfer from the heating element 100 to the primary refrigerant 20 in a liquid phase is smoothly performed, and thermal resistance to the primary refrigerant 20 from the heating element 100 can be reduced.

The condensation tube 40 is a tubular member, and the secondary refrigerant 30 flows through an inner space of the condensation tube 40. The condensation tube 40 penetrates through the gaseous phase portion U in the inside of the container 10. The condensation tube 40 is located upward in the gravity direction, of the inner surface 15 of the container 10 in the part to which the heating element 100 is thermally connected. An inner space of the condensation tube 40 does not communicate with the inside (the cavity portion 13) of the container 10. In other words, the inner space of the condensation tube 40 is a space that does not communicate with the gaseous phase portion 11, and is independent from the gaseous phase portion 11. Further, the condensation tube 40 does not contact the primary refrigerant 20 in a liquid phase that is stored at the lower side in the gravity direction. In other words, the primary refrigerant 20 in a liquid phase does not contact the condensation tube 40 in which the secondary refrigerant is stored. A sectional shape in a width direction (that is, a radial direction) of the condensation tube 40 is not specially limited, and is substantially circular in the cooling device 1.

A through-hole (not illustrated) is formed in a part corresponding to the gaseous phase portion 11, of the container 10, and the condensation tube 40 is inserted through the through-hole, and thereby the condensation tube 40 is mounted to the container 10 while keeping a sealed state of the cavity portion 13. While a number of the condensation tubes 40 is not specially limited, in the cooling device 1, the plurality of condensation tubes 40, 40 . . . are provided. In the cooling device 1, the plurality of condensation tubes 40, 40 . . . are disposed in layers. In the cooling device 1, the condensation tubes 40 are disposed in multiple layers (two layers in FIG. 1), a plurality of first condensation tubes 40-1, 40-1 . . . that are disposed on a liquid-phase primary refrigerant 20 side, and a plurality of second condensation tubes 40-2, 40-2 . . . that are disposed above the first condensation tubes 40-1 in the gravity direction are provided. The plurality of first condensation tubes 40-1, 40-1 . . . are disposed in parallel with one another on a substantially same plane, and the plurality of second condensation tubes 40-2, 40-2, . . . are disposed in parallel with one another on a substantially same plane.

Further, an extending direction of the first condensation tube 40-1 in the gaseous phase portion 11 of the container 10 may be same as or different from an extending direction of the second condensation tube 40-2, but in the cooling device 1, the extending direction of the first condensation tube 40-1 is different from the extending direction of the second condensation tube 40-2. In the gaseous phase portion 11, the extending direction of the first condensation tube 40-1 is substantially an orthogonal direction to the extending direction of the second condensation tube 40-2.

In the condensation tube 40, the secondary refrigerant 30 in a liquid phase flows in a fixed direction along an extending direction of the condensation tube 40. Accordingly, the secondary refrigerant 30 flows to penetrate through the gaseous phase portion 11 via a wall surface of the condensation tube 40. The secondary refrigerant 30 is cooled to a liquid temperature which is lower than an allowable maximum temperature of the heating element 100, for example.

As illustrated in FIG. 2, in the cooling device 1, a condensation tube outer surface area increasing portion 43 that increases a contact area with the primary refrigerant in a gaseous phase is formed by increasing a surface area of an outer surface 41 of the condensation tube 40 such as recesses and protrusions is formed on an outer surface 41 of the condensation tube 40. The condensation tube outer surface area increasing portion 43 is formed, whereby the heat exchange action of the condensation tube 40 is improved, and phase change of the primary refrigerant 20 from the gaseous phase to the liquid phase is promoted. As a result, heat transfer from the primary refrigerant 20 to the secondary refrigerant 30 is more promoted, and the cooling characteristics of the cooling device 1 are further improved. The condensation tube outer surface area increasing portion 43 may be formed on the entire outer surface 41 that contacts the primary refrigerant in a gaseous phase, or may be formed only on a region (for example, a lower side in the gravity direction of the outer surface 41) of a part of the outer surface 41.

The condensation tube outer surface area increasing portion 43 can be provided, for example, by molding of the condensation tube 40 using a molding die, or mounting a separate member from the condensation tube 40 on the outer surface 41 of the condensation tube 40. A mode of the condensation tube outer surface area increasing portion 43 is not specially limited, and a plurality of fins formed on the outer surface 41 of the condensation tube 40, a plurality of protrusions formed on the outer surface 41 of the condensation tube 40, a plurality of grooves, dents and the like formed on the outer surface 41 of the condensation tube 40 can be cited. A forming method of the fins is not specially limited, and, for example, methods of attaching fins that are additionally produced to the outer surface 41 of the condensation tube 40 by soldering, brazing, sintering and the like are cited. As a method for forming protrusions, for example, a method of attaching protrusions additionally produced to the outer surface 41 of the condensation tube 40 by soldering, brazing, sintering or the like, a method of cutting the outer surface 41 of the condensation tube 40, an etching method and the like are cited. Further, as a forming method of the dented portions, and the grooves, for example, a method of cutting the outer surface 41 of the condensation tube 40, an etching method and the like are cited.

In the condensation tube outer surface area increasing portion 43 in FIG. 2, a plurality of thin-plate-shaped fins 47, 47, ... are disposed in parallel on the outer surface 41 of the condensation tube 40. More specifically, in the condensation tube outer surface area increasing portion 43 in FIG. 2, the respective fins 47 are provided to be upright along a circumferential direction of the condensation tube 40 on the outer surface 41 of the condensation tube 40. In the condensation tube outer surface area increasing portion 43, a fin row 48 is formed by the plurality of fins 47 being disposed in parallel at predetermined intervals in a longitudinal direction of the condensation tube 40. Since the condensation tube 40 has the condensation tube outer surface area increasing portion 43 as described above, a contact area with the primary refrigerant in the gaseous phase increases, the heat exchange action of the outer surface 41 of the condensation tube 40 is improved, and the phase change from the gaseous phase to the liquid phase of the primary refrigerant is promoted. As a material of the fin 47, for example, metals such as a copper, and a copper alloy can be cited.

Further, as illustrated in FIGS. 1 and 2, the porous member 200 having a capillary force is provided on the outer surface 41 of the condensation tube 40 in the inside of the container 10. The porous member 200 extends along the longitudinal direction of the condensation tube 40, that is, the flowing direction of the secondary refrigerant 30. Further, the porous member 200 is in contact with the outer surface 41 of the condensation tuber 40, more specifically, the fins 47 that are the condensation tube outer surface area increasing portion 43.

As illustrated in FIGS. 3A and 3B, the porous member 200 is provided at a lower side in a gravity direction from a center line L in an orthogonal direction to a gravity direction G in a section in the width direction of the condensation tube 40, of the outer surface 41 of the condensation tube 40. The porous member 200 is not provided at an upper side in the gravity direction from the center line L in the cooling device 1, a flat portion 47' is formed by grinding a part at the lower side in the gravity direction, of the fin 47, and by mounting the porous member 200 to the flat portion 47', the porous member 200 is in a state contacting the condensation tube outer surface increasing portion 43. From the above, the porous member 200 is provided at a part (bottom portion 49 of the condensation tube 40) of the condensation tube 40, which faces a liquid level of the primary refrigerant 20 in a liquid phase stored in the inside of the container 10, of the condensation tube 40. In the cooling device 1, the porous member 200 is not provided in a part other than the bottom portion 49, of the condensation tube 40, that is, both side surface portions and an upper portion of the condensation tube 40. From the above, in the condensation tube 40, the fins 47 that are the condensation tube outer surface area increasing portion 43 are exposed on both the side surface portions and the upper portion of the condensation tube 40, and the porous member 200 is exposed on the bottom portion 49 of the condensation tube 40.

A shape of the porous member 200 in the section in the width direction of the condensation tube 40 is not specially limited, but as illustrated in FIGS. 3A and 3B, in the cooling device 1, the shape of the above described section is in a substantially T-shape. The porous member 200 has an extension portion 201 extended along the gravity direction G, and a base portion 202 that is in the width direction of the condensation tube 40, and is extended along the orthogonal direction to the gravity direction G. The extension portion 201 extends along the gravity direction G from a center portion in the width direction of the base portion 202. The extension portion 201, and the base portion 202 are both in a sheet shape.

As the porous member 200, it is possible to cite a sheet-shaped member, for example. By bending the sheet-shaped member, the porous member 200 with a shape of the above described section being in a substantially T-shape can be made. Further, as a kind of the porous member, it is possible to cite a metal mesh formed of a metal such as a copper, or a copper alloy, for example. Further, a method for mounting the porous member 200 to the flat portion 47' is not specially limited, and for example, welding, soldering, brazing and the like can be cited.

The primary refrigerant 20 that changes in phase from a gaseous phase to a liquid phase by the heat exchange action of the condensation tube 40 adheres to the outer surface 41 of the condensation tube 40, and is held among the fins 47 that are the condensation tube outer surface increasing portion 43 by surface tension or the like, but in the cooling device 1, the primary refrigerant 20 in a liquid phase held by the outer surface 41 of the condensation tube 40 and the condensation tube outer surface area increasing portion 43 flows into the porous member 200 by the capillary force of the porous member 200 provided on the outer surface 41 of the condensation tube 40. Thereby, it is possible to prevent the primary refrigerant 20 in the liquid phase from being held by the outer surface 41 of the condensation tube 40 and the condensation tube outer surface area increasing portion 43. Since in the cooling device 1, it is possible to prevent the primary refrigerant 20 in a liquid phase from being held by the outer surface 41 of the condensation tube 40 and the condensation tube outer surface area increasing portion 43 in this way, heat exchange characteristics between the primary refrigerant in a gaseous phase and the secondary refrigerant 30 via the condensation tube 40 are improved. Since the heat exchange characteristics between the primary refrigerant 20 and the secondary refrigerant 30 are improved, heat resistance of the cooling device 1 is reduced, and as a result, the cooling device 1 can exhibit excellent cooling characteristics.

Further, in the cooling device 1, the porous member 200 is provided at the lower side in the gravity direction from the center line L in the orthogonal direction to the gravity direction G in the section in the width direction of the condensation tube 40, and therefore the primary refrigerant 20 in a liquid phase is smoothly removed from the outer surface 41 of the condensation tube 40, and can smoothly return to the primary refrigerant 20 in the liquid phase that is stored in the inside of the container 10 from the porous member 200 by the action of gravity, while preventing inhibition of a heat exchange action of the condensation tube 40 by the porous member 200 itself. Further, in the cooling device 1, the porous member 200 has the extension portion 201 extended along the gravity direction G, and therefore, the primary refrigerant 20 in the liquid phase can more smoothly return to the primary refrigerant 20 in the liquid phase stored in the inside of the container 10 from the porous member 200 by the action of gravity. Further, in the cooling device 1, the porous member 200 is in contact with the outer surface 41 (condensation tube outer surface area increasing portion 43) of the condensation tube 40, whereby the primary refrigerant 20 in the liquid phase can quickly flow into the porous member 200 from the outer surface 41 of the condensation tube 40, and the porous member 200 can also contribute to heat exchange between the primary refrigerant in a gaseous phase and the secondary refrigerant 30.

Further, as illustrated in FIG. 4, in the cooling device 1, a condensation tube inner surface area increasing portion 44 that increases a contact area of an inner surface 42 of the condensation tube 40 and the secondary refrigerant 30 by increasing a surface area of the inner surface 42 of the condensation tube 40, such as recesses and protrusions, is formed on the inner surface 42 of the condensation tube 40. The condensation tube inner surface area increasing portion 44 is formed, whereby the heat exchange action of the condensation tube 40 is improved, and heat transfer to the secondary refrigerant 30 from the primary refrigerant 20 is promoted more.

The condensation tube inner surface area increasing portion 44 can be provided, for example, by molding of the condensation tube 40 using a molding die, or mounting a separate member from the condensation tube 40 to the inner surface 42 of the condensation tube 40. A mode of the condensation tube inner surface area increasing portion 44 is not specially limited, and a plurality of projections formed on the inner surface 42 of the condensation tube 40, a plurality of grooves, dents or the like formed on the inner surface 42 of the condensation tube 40 can be cited. As a forming method of projections, for example, a method of mounting projections separately produced to the inner surface 42 of the condensation tube 40 by soldering, brazing, sintering or the like, a method of cutting the inner surface 42 of the condensation tube 40, a method of etching and the like are cited. Further, as a forming method of dent portions or the grooves, for example, a method of cutting the inner surface 42 of the condensation tube 40, a method of etching and the like are cited. In the condensation tube inner surface area increasing portion 44 in the cooling device 1, a plurality of grooves are spirally formed on the inner surface 42.

As illustrated in FIG. 1, in a cooling device 1 according to the first embodiment, in a region corresponding to a part to which the heating element 100 is thermally connected, in an inner surface 15 of a container 10, a container inner surface area increasing portion 50 that is a part that increases a surface area of the inner surface 15 of the container 10, such as protrusions and recesses, is formed. Since the container inner surface area increasing portion 50 is formed, a contact area of the inner surface 15 of the container 10 and a primary refrigerant 20 in a liquid phase increases, in the region corresponding to the part to which the heating element 100 is thermally connected, in the inner surface 15 of the container 10. Accordingly, by the container inner surface area increasing portion 50, heat transfer to the primary refrigerant 20 in a liquid phase from the heating element 100 via the container 10 is performed smoothly. As a result, phase change to a gaseous phase from a liquid phase of the primary refrigerant 20 is promoted, and cooling characteristics of the cooling device 1 are more improved.

The container inner surface area increasing portion 50 is immersed in the primary refrigerant in a liquid phase stored in the container 10, Accordingly, the container inner surface area increasing portion 50 directly contacts the primary refrigerant 20 in a liquid phase. The entire container inner surface area increasing portion 50 may be immersed in the primary refrigerant 20 in a liquid phase, or a part of the container inner surface area increasing portion 50 may be immersed in the primary refrigerant 20. Note that in the cooling device 1, the entire container inner surface area increasing portion 50 is immersed in the primary refrigerant 20 in a liquid phase.

The container inner surface area increasing portion 50 can be provided by molding of the container 10 by using a molding die, or by mounting a separate member from the container 10 to the inner surface 15 of the container 10, for example. As a mode of the container inner surface area increasing portion 50, for example, protruded and recessed portions formed on the inner surface 15 of the container 10 can be cited, for example, and as specific examples, it is possible to cite the thin-plate-shaped fins and pin fins that are provided to be upright on the inner surface 15 of the container 10, and dented portions, groove portions and the like that are formed on the inner surface 15 of the container 10. As a method for forming the thin-plate-shaped fins, and pin fins, it is possible to cite a method of attaching the thin-plate-shaped fins, and the pin fins that are additionally produced to the inner surface 15 of the container 10 by soldering, brazing, sintering or the like, a method of cutting the inner surface 15 of the container 10, an extruding method, an etching method, and the like, for example. As a method for forming the dented portions, and the groove portions, it is possible to cite a method of cutting the inner surface 15 of the container 10, an extruding method, an etching method, and the like, for example. Note that in the cooling device 1, a plurality of square or rectangular thin-plate-shaped fins are disposed in parallel as the container inner surface area increasing portion 50.

A material of the container inner surface area increasing portion 50 is not specially limited, and, for example, a thermal conductive member can be cited. As specific examples of the material of the container inner surface area increasing portion 50, a metal member (for example, copper, a copper alloy, aluminum, an aluminum alloy, stainless steel and the like), and a carbon member (for example, graphite and the like) can be cited. Further, at least a part of the container inner surface area increasing portion 50 may be formed of a sintered body of a thermal conductive material, or an aggregate of a particulate thermal conductive material, and may be formed of, for example, a metal sintered body or an aggregate of carbon particles. The metal sintered body and the aggregate of carbon particles may be provided on a surface portion of the container inner surface area increasing portion 50, for example. More specifically, for example, a sintered body of a thermal conductive material such as a metal sintered body, and an aggregate of a particulate thermal conductive material such as an aggregate of carbon particles and/or metal powder may be formed in layers on surface portions of the thin-plate-shaped fins, or the pin fins provided to be upright on the inner surface 15 of the container 10, and the dented portions, groove portions or the like formed on the inner surface 15 of the container 10. A porous portion is formed in the container inner surface area increasing portion 50 because at least a part of the container inner surface area increasing portion 50 is formed of a sintered body of a thermal conductive material, or an aggregate of a particulate thermal conductive material, so that phase change of the primary refrigerant 20 from a liquid phase to a gaseous phase is further promoted, and the cooling characteristics of the cooling device 1 are further improved. When the container inner surface area increasing portion 50 is formed of the sintered body of a thermal conductive material, or an aggregate of a particulate thermal conductive material, the entire container inner surface area increasing portion 50 becomes a porous body, and the primary refrigerant in a gaseous phase is generated and stays in the porous body, so that thermal conductivity from the container inner surface area increasing portion 50 to the primary refrigerant 20 in the liquid phase may not sufficiently be obtained. However, since the sintered body of the thermal conductive material, or the aggregate of the particulate thermal conductive material is formed in layers on the surface portions of the thin-plate-shaped fins, pin fins, the dented portions, the groove portions or the like, the thermal conductivity from the container inner surface area increasing portion 50 to the primary refrigerant 20 in a liquid phase is improved while phase change from the liquid phase to the gaseous phase of the primary refrigerant 20 is further promoted, and as a result, the cooling characteristics of the cooling device 1 are further improved. As the material of the metal sintered body, for example, metal powder, metal fiber, metal mesh, metal braid, metal foil and the like can be cited. These metal materials may be used individually, or in combination of two or more. Further, a kind of metal of the metal sintered body is not specially limited, and, for example, copper, a copper alloy and the like can be cited. The metal sintered body can be formed by heating a metal material by heating means such as a furnace. Further, by thermally spraying metal powder to a surface, an aggregate of a particulate thermal conductive material that is in a coating film form having fine protrusions and recesses can be formed. Further, an aggregate of a particulate thermal conductive material may be formed by melting and forming metal powder by laser or the like. Further, carbon particles forming the aggregate of carbon particles is not specially limited, and for example, carbon nano particles, carbon black and the like can be cited.

A material of the container 10 is not specially limited, and for example, copper, a copper alloy, aluminum, an aluminum alloy, nickel, a nickel alloy, stainless steel, titanium, a titanium alloy and the like can be cited. A material of the condensation tube 40 is not specially limited, and, for example, copper, a copper alloy, aluminum, an aluminum alloy, nickel, a nickel alloy, stainless steel, titanium, a titanium alloy and the like can be cited. The primary refrigerant is not specially limited, but a wide range of materials can be used, and for example, an electrically insulating refrigerant can be cited. As specific examples, for example, water, fluorocarbons, cyclopentane, ethylene glycol, a mixture of these substances and the like can be cited. Among the primary refrigerants, from a viewpoint of electrical insulation, fluorocarbons, cyclopentane, and ethylene glycol are preferable, and fluorocarbons are specially preferable. The secondary refrigerant is not specially limited, and, for example, water, antifreeze (main component is, for example, ethylene glycol) and the like can be cited.

Next, the operation of the cooling device 1 according to the first embodiment and the cooling system using the cooling device 1 will be described. First, the operation of the cooling device 1 will be described.

The primary refrigerant 20 in a liquid phase stored in the cavity portion 13 of the container 10 receives heat from the heating element 100, thereby changes in phase from the liquid phase to a gaseous phase, and absorbs the heat from the heating element 100 as latent heat. The primary refrigerant that changes in phase to the gaseous phase moves upward in the gravity direction in the inner space of the container 10, and flows into the gaseous phase portion 11 of the container 10. On the other hand, in the condensation tube 40 penetrating through the gaseous phase portion 11, the secondary refrigerant 30 having a low temperature flows. The secondary refrigerant 30 with a low temperature flows through the condensation tube 40, and thereby the condensation tube 40 disposed in the gaseous phase portion 11 exhibits a heat exchange action. The primary refrigerant which changes in phase to the gaseous phase contacts or approaches the outer surface 41 of the condensation tube 40, thereby releases the latent heat by the heat exchange action of the condensation tube 40, and changes in phase to a liquid phase from the gaseous phase. The latent heat released from the primary refrigerant at the time of phase change to the liquid phase from the gaseous phase is transferred to the secondary refrigerant 30 that flows through the condensation tube 40. Further, the primary refrigerant which changes in phase to the liquid phase returns in the gravity direction G from the gaseous phase portion 11 as the primary refrigerant 20 in the liquid phase, by the action of gravity. From the above description, the primary refrigerant 20 repeats phase change to the gaseous phase from the liquid phase and to the liquid phase from the gaseous phase in the inner space of the container 10. The secondary refrigerant 30 that receives heat from the primary refrigerant flows from the inside to the outside of the cooling device 1 along the extending direction of the condensation tube 40, and thereby heat of the heating element 100 is transported to the outside of the cooling device 1.

Next, the cooling system using the cooling device 1 according to the first embodiment will be described. In the cooling system using the cooling device 1, the cooling device 1, and a secondary refrigerant cooling portion (not illustrated) to which the condensation tube 40 extending from the cooling device 1 are used. Further, in the above described cooling system, a circulation path of the condensation tube 40 in which the condensation tube 40 circulates in a loop shape in the cooling device 1 and the secondary refrigerant cooling portion is formed. The secondary refrigerant 30 receiving heat from the primary refrigerant flows through the condensation tube 40 from the cooling device 1 to the secondary refrigerant cooling portion, and is cooled to a predetermined liquid temperature, for example, a liquid temperature lower than the allowable maximum temperature of the heating element 100, for example, in the secondary refrigerant cooling portion. The secondary refrigerant 30 which is cooled in the secondary refrigerant cooling portion flows through the condensation tube 40, returns to the cooling device 1 from the secondary refrigerant cooling portion, and exhibits a heat exchange action in the gaseous phase portion 11 of the cooling device 1. Accordingly, the secondary refrigerant 30 circulates in the loop shape in the cooling device 1 and the secondary refrigerant cooling portion, and thereby the secondary refrigerant 30 which is cooled is continuously supplied to a region of the gaseous phase portion 11.

Figure 5:
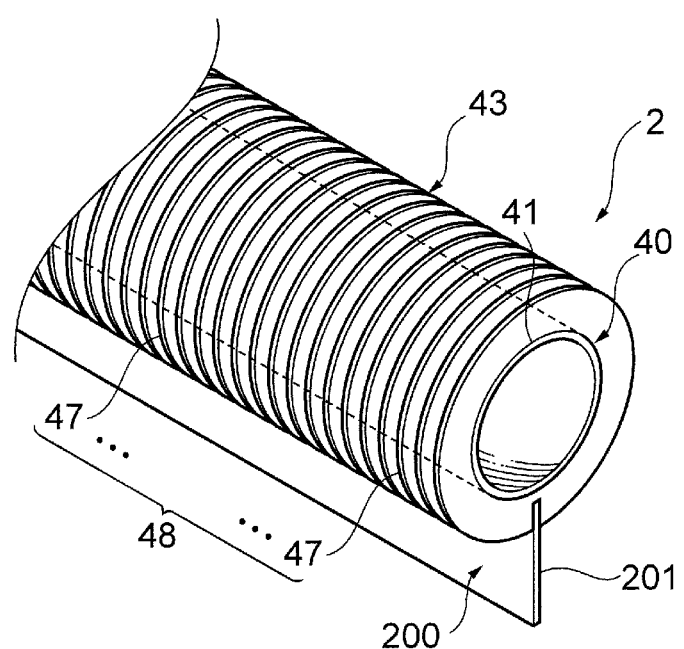
FIG. 5 is a perspective view of a part of a condensation tube provided in a cooling device according to a second embodiment of the present disclosure.
Figure 6A:
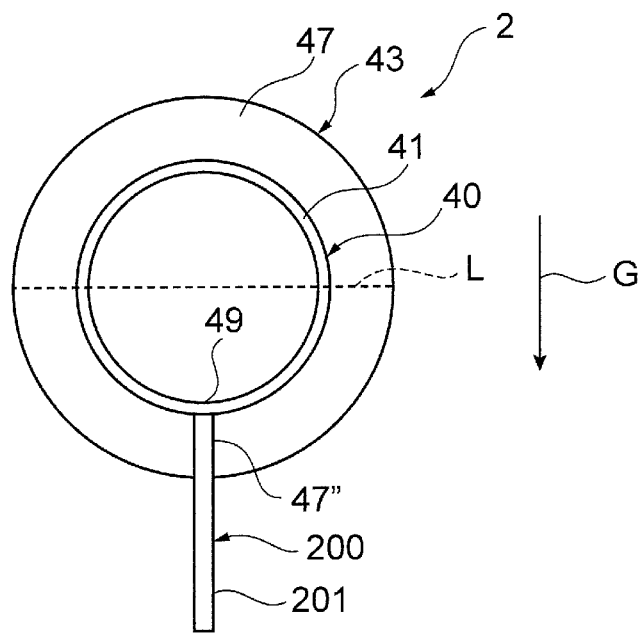
FIG. 6A is a front view of the part of the condensation tube provided in the cooling device according to the second embodiment of the present disclosure.

Next, a cooling device according to a second embodiment of the present disclosure will be described. Note that in the cooling device according to the second embodiment, a main part has a same configuration as the main part of the cooling device according to the first embodiment, and therefore, same components as the components of the cooling device according to the first embodiment will be described by using the same reference signs. Note that FIG. 5 is a perspective view of a part of a condensation tube provided in the cooling device according to the second embodiment of the present disclosure. FIG. 6A is a front view of the part of the condensation tube provided in the cooling device according to the second embodiment of the present disclosure, and FIG. GB is a perspective view of the part of the condensation tube provided in the cooling device according to the second embodiment of the present disclosure.

Figure 6B:
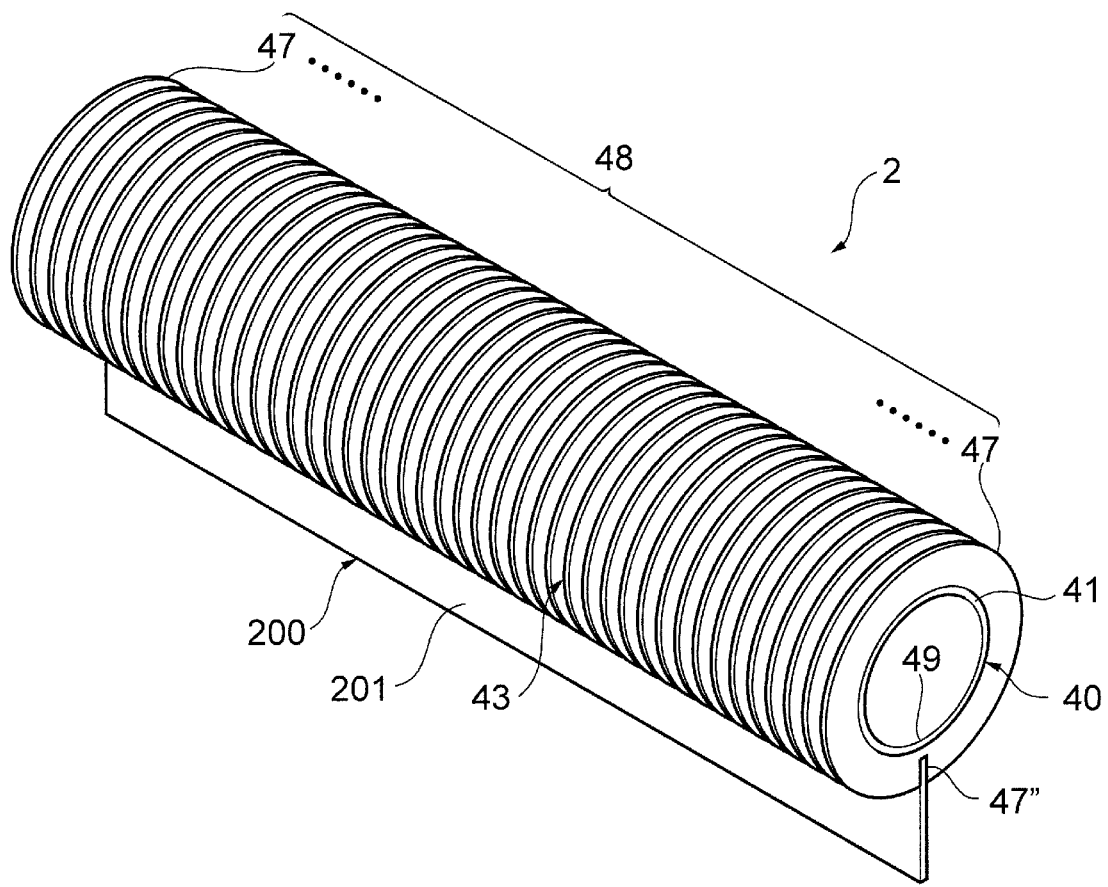
FIG. 6B is a perspective view of the part of the condensation tube provided in the cooling device according to the second embodiment of the present disclosure.

In the cooling device 1 according to the first embodiment, in the fin 47, the part at the lower side in the gravity direction is grinded to form the flat portion 47', and the porous member 200 is mounted to the flat portion 47', but as illustrated in FIG. 5, and FIGS. 6A and 6B, in a cooling device 2 according to the second embodiment, a notch 47" is formed along the gravity direction G in a part at a lower side in a gravity direction, of the fin 47, and a porous member 200 is inserted in the notch 47", whereby the porous member 200 is mounted to a condensation tube outer surface increasing portion 43.

In the cooling device 2, a shape of the porous member 200 in a section in a width direction of a condensation tube 40 is a substantially I-shape. The porous member 200 has an extension portion 201 extended along the gravity direction G, but does not have a base portion 202 extended along the width direction of the condensation tube 40. In the cooling device 2, the fin 47 that is the condensation tube outer surface area increasing portion 43 is exposed on both side surface portions and an upper portion of the condensation tube 40, and the fin 47 is also exposed on a bottom portion 49 of the condensation tube 40. Accordingly, the cooling device 2 has a larger exposed area of the fin 47 that is the condensation tube outer surface area increasing portion 43 as compared with the cooling device 1 according to the first embodiment.

In the cooling device 2, a primary refrigerant 20 in a liquid phase is smoothly removed from an outer surface 41 of the condensation tube 40 while more reliably preventing inhibition of a heat exchange action of the condensation tube 40 by the porous member 200 itself.

Figure 7:
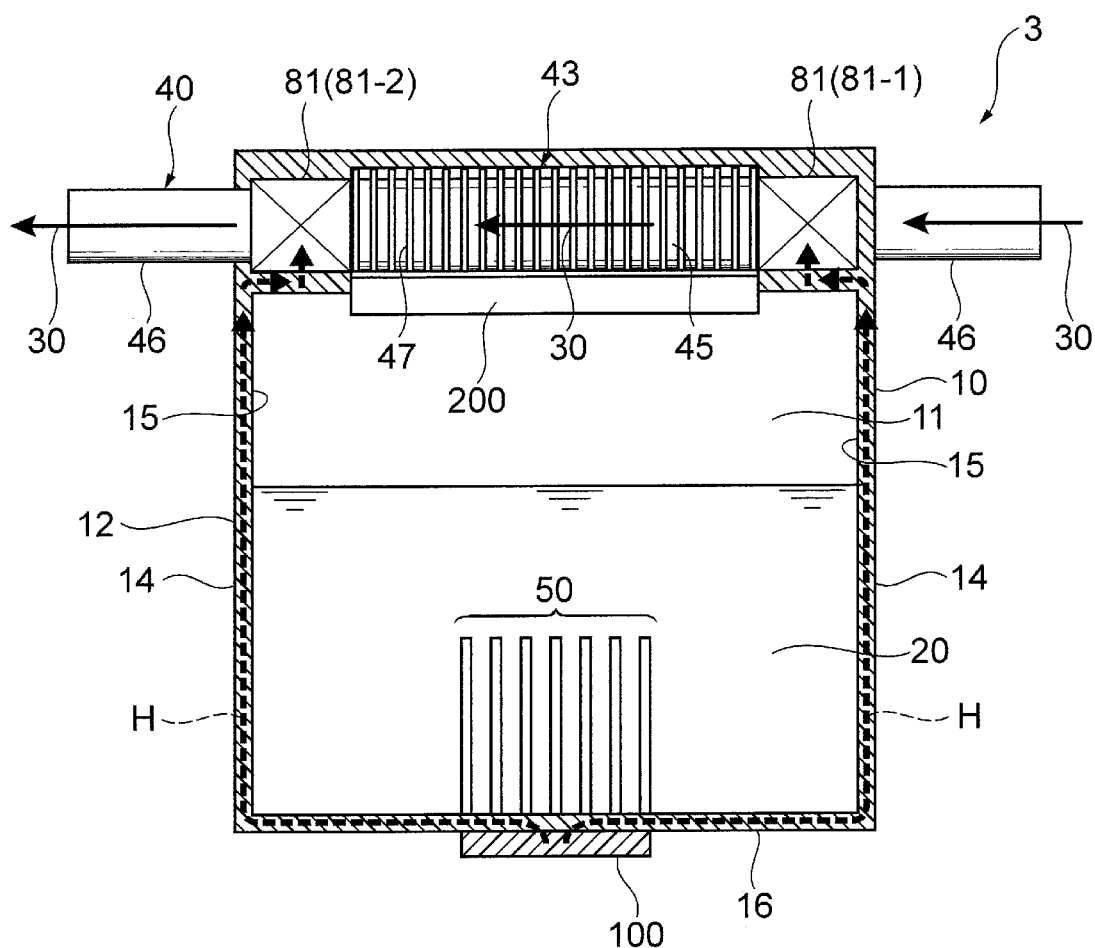
FIG. 7 is a side sectional view explaining an outline of a cooling device according to a third embodiment of the present disclosure.
Figure 8:
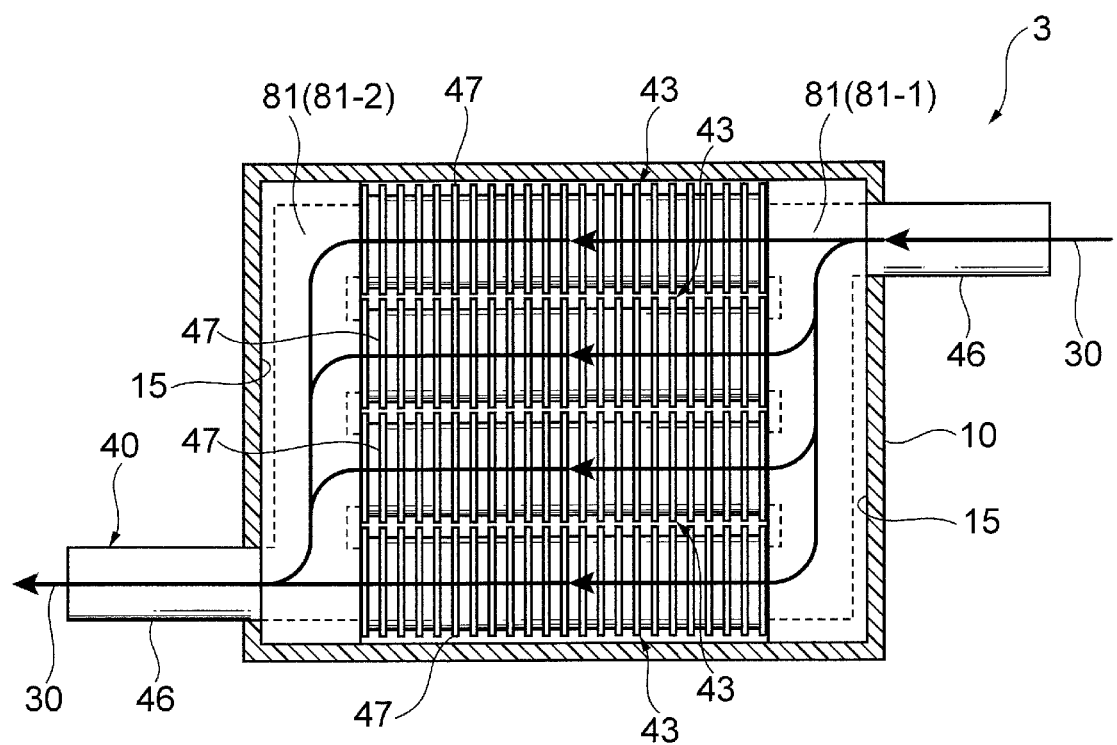
FIG. 8 is a plane sectional view explaining the outline of the cooling device according to the third embodiment of the present disclosure.

Next, a cooling device according to a third embodiment of the present disclosure will be described. Note that in the cooling device according to the third embodiment, a main part has a same configuration as the main parts of the cooling devices according to the first and second embodiments, and therefore, same components as the components of the cooling devices according to the first and second embodiments will be described by using the same reference signs. Note that FIG. 7 is a side sectional view explaining an outline of the cooling device according to the third embodiment of the present disclosure. FIG. 8 is a plane sectional view explaining the outline of the cooling device according to the third embodiment of the present disclosure.

As illustrated in FIGS. 7 and 8, in a cooling device 3 according to the third embodiment, a secondary refrigerant storing block 81 in which a secondary refrigerant 30 is stored is further provided in a condensation tube 40 at which a porous member 200 is provided. On the condensation tube 40, a condensation tube outer surface area increasing portion 43 formed of a plurality of fins 47, 47 . . . is formed. Note that in the cooling device 3, parts except for the condensation tube 40 have a same configuration as the configuration of the cooling device 1 according to the first embodiment.

The secondary refrigerant storing block 81 is provided in the inside of a container 10. Further, the secondary refrigerant storing block 81 has a first secondary refrigerant storing block 81-1 connected to a secondary refrigerant 30 upstream side end portion (one end) of the condensation tube portion 45 in the inside of the container 10, and a second secondary refrigerant storing block 81-2 connected to a secondary refrigerant 30 downstream side end portion (another end) of the condensation tube portion 45 in the inside of the container 10, of the condensation tube 40. Both of the first secondary refrigerant storing block 81-1 and the second secondary refrigerant storing block 81-2 are hollow block members.

In the cooling device 3, of the condensation tube 40, a plurality (four in the cooling device 3) of condensation tube portions 45 on each of which the condensation tube outer surface area increasing portion 43 is formed and the porous member 200 is mounted are provided, and the plurality of condensation tube portions 45, 45, . . . are disposed in parallel with one another on a substantially same plane. On the other hand, a number of condensation tube portions 46, of the condensation tubes 40 in outside of the container 10 is one system (that is, one). From the above, the condensation tube 40 is in a mode branched in the parts of the secondary refrigerant storing blocks 81. Note that the porous member 200 is not mounted to the condensation tube portion 46.

As illustrated in FIGS. 7 and 8, the plurality of condensation tube portions 45, 45 . . . in the inside of the container 10 respectively communicate with the first secondary refrigerant storing block 81-1 and the second secondary refrigerant storing block 81-2, and the first secondary refrigerant storing block 81-1 and the second secondary refrigerant storing block 81-2 respectively communicate with the condensation tube portion 46 in the outside of the container 10. From the above description, one ends of the plurality of condensation tube portions 45, 45 . . . in the inside of the container 10 communicate with the condensation tube portion 46 in the outside of the container 10 via the first secondary refrigerant storing block 81-1. Further, the plurality of condensation tube portions 45, 45 . . . communicate with one another via the first secondary refrigerant storing block 81-1. In the same way, other ends of the plurality of condensation tube portions 45, 45 . . . in the inside of the container 10 communicate with the condensation tube portion 46 in the outside of the container 10 via the second secondary refrigerant storing block 81-2. Further, the plurality of condensation tube portions 45, 45 . . . communicate with one another via the second secondary refrigerant storing block 81-2.

As illustrated in FIG. 8, the secondary refrigerant 30 that flows to the inside of the container 10 from the condensation tube portion 46 in the outside of the container 10 stays for a predetermined time period after flowing to the inside of the first secondary refrigerant storing block 81-1, and thereafter branches and flows into the respective condensation tube portions 45, 45 . . . . The secondary refrigerant 30 that branches and flows into the respective condensation tube portions 45, 45 . . . flows to the other ends from the one ends of the respective condensation tube portions 45, 45 . . . , meets in the inside of the second secondary refrigerant storing block 81-2 and thereafter stays for a predetermined time period, after which, the secondary refrigerant 30 flows to the condensation tube portion 46 in the outside of the container 10 from the inside of the container 10. Positions of an inflow port of the secondary refrigerant 30 of the first secondary refrigerant storing block 81-1, and an outflow port of the secondary refrigerant 30 of the second secondary refrigerant storing block 81-2 are not specially limited, but, for example, from a viewpoint of the cooling characteristics, it is preferable to dispose the inflow port and the outflow port so that a high flow velocity of the secondary refrigerant 30 is obtained in a part overlapping the heating element 100 in plan view. In FIG. 8, the position of the inflow port of the secondary refrigerant 30 of the first secondary refrigerant storing block 81-1 is provided at one end of the first secondary refrigerant storing block 81-1, and the position of the outflow port of the secondary refrigerant 30 of the second secondary refrigerant storing block 81-2 is provided at the other end of the second secondary refrigerant storing block 81-2.

Further, the secondary refrigerant storing block 81 is thermally connected to the container 10. In the cooling device 3, the first secondary refrigerant storing block 81-1 and the second secondary refrigerant storing block 81-2 are respectively in contact with the inner surface 15 of the container 10, whereby the secondary refrigerant storing block 81 is thermally connected to the container 10. In the cooling device 3, the first secondary refrigerant storing block 81-1 and the second secondary refrigerant storing block 81-2 are in contact with side surfaces 14 of the container 10.

As illustrated in FIG. 7, in the cooling device 3 in which the secondary refrigerant storing block 81 is provided, heat H of the heating element 100 which is thermally connected to a bottom surface 16 of the container 10 is transferred to the bottom surface 16 of the container 10 from the heating element 100, and a part of the heat H of the heating element 100 that is transferred to the bottom surface 16 of the container 10 is transferred to the side surface 14 from the bottom surface 16 of the container 10. The heat H that is transferred to the side surface 14 of the container 10 is transferred to the secondary refrigerant 30 in the secondary refrigerant storing block 81 from the side surface 14 of the container 10, and the secondary refrigerant 30 receiving heat flows to the condensation tube portion 46 in the outside of the container 10 from the secondary refrigerant storing block 81, whereby the heat H of the heating element 100 is transported to the outside of the cooling device 3. Further, in the cooling device 3, a part of the heat H of the heating element 100 is transferred to the side surface 14 from the bottom surface 16 of the container 10, and therefore, the side surface 14 of the container 10 functions as a heat radiating portion.

From the above description, in the cooling device 3, the secondary refrigerant storing block 81 has a function of transferring the heat H of the heating element 100 to the secondary refrigerant 30, and therefore, cooling characteristics are further improved. Further, in the cooling device 3, the side surface 14 of the container 10 functions as the heat radiating portion, and therefore the cooling characteristics are further improved.

Next, a coding device according to a fourth embodiment of the present disclosure will be described. Note that in the cooling device according to the fourth embodiment, a main part has a same configuration as the configurations of the main parts of the cooling devices according to the first to third embodiments, and therefore, same components as the components of the cooling devices according to the first to third embodiments will be described by using the same reference signs. Note that FIG. 9 is a front view of a part of a condensation tube provided in the cooling device according to the fourth embodiment of the present disclosure.

Figure 9:
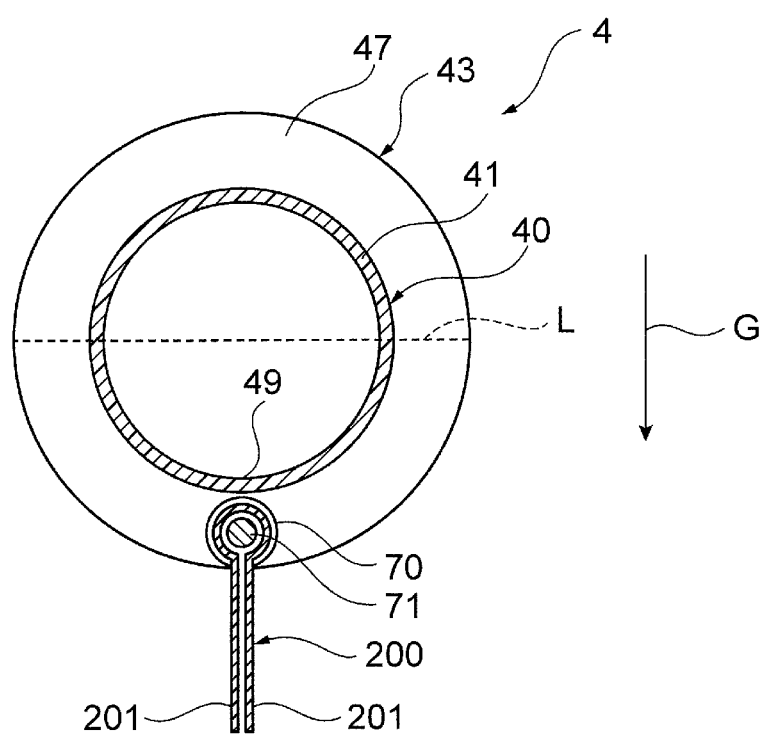
FIG. 9 is a front view of a part of a condensation tube provided in a cooling device according to a fourth embodiment of the present disclosure.

In the cooling device 2 according to the second embodiment, the notch 47″ is formed in the fin 47, and the porous member 200 is inserted in the notch 47″, but as illustrated in FIG. 9, in a cooling device 4 according to the fourth embodiment, a cut-hole-shaped depression portion 70 is formed in a part at a lower side in a gravity direction, of the fin 47, and the porous member 200 is sandwiched by a wire member 71 inserted in the depression portion 70 and the depression portion 70. The porous member 200 is sandwiched by the wire member 71 and the depression portion 70, and thereby the porous member 200 is mounted to the fin 47 that is a condensation tube outer surface area increasing portion 43.

In the cooling device 4, the sheet-shaped porous member 200 is mounted to the fin 47 in a state folded in two, and the porous member 200 is sandwiched by the wire member 71 and the depression portion 70 at a part folded in two. Accordingly, an outer peripheral surface of the wire member 71 is substantially covered with the porous member 200. Since the porous member 200 is sandwiched by the wire member 71 and the depression portion 70 at the part folded in two, the porous member 200 has two extension portions 201 extended along a gravity direction G, and the two extension portions 201 are disposed at a predetermined interval.

The depression portion 70 is provided at a position corresponding to a bottom portion 49 of a condensation tube 40. A shape in front view of the depression portion 70 is not specially limited, but is substantially circular in the cooling device 4. As the wire member 71, for example, a solid wire member is cited. As a material of the wire member 71, for example, a metal wire such as a copper wire can be cited.

Next, an example of a method for mounting the porous member 200 to the fin 47 in the cooling device 4 will be described. First, the cut-hole-shaped depression portion 70 is formed in the part at the lower side in the gravity direction of the fin 47, and a folded portion of the porous member 200 that is folded in two is inserted in the depression portion 70 from the lower side in the gravity direction. Next, the wire member 71 is inserted into the depression portion 70 along an extending direction of the condensation tube 40. At this time, the wire member 71 is inserted into the depression portion 70 so that the folded portion of the porous member 200 covers an outer peripheral surface of the wire member 71, and thereby the porous member 200 can be mounted to the fin 47. As a method for forming the cut-hole-shaped depression portion 70, for example, electrical-discharge machining is cited. In order to facilitate insertion of the wire member 71 into the depression portion 70, a tip end of the wire member may be made a sharp tip end portion by polishing the tip end, as necessary.

In the cooling device 4, the primary refrigerant 20 in a liquid phase that is held by an outer surface 41 of the condensation tube 40 moves to the porous member 200 from the outer surface 41 of the condensation tube 40 by a capillary force of the porous member 200, and therefore the primary refrigerant 20 in the liquid phase is smoothly removed from the outer surface 41 of the condensation tube 40. The primary refrigerant 20 in the liquid phase flows downward in the gravity direction in the two extension portions 201 by an action of gravity, and can smoothly return to the primary refrigerant 20 in the liquid phase that is stored in an inside of a container 10 from the porous member 200. Accordingly, in the cooling device 4, it is possible to prevent the primary refrigerant 20 in the liquid phase from being held by the outer surface 41 of the condensation tube 40 and the condensation tube outer surface area increasing portion 43, and therefore, heat exchange characteristics between the primary refrigerant in a gaseous phase and the secondary refrigerant 30 via the condensation tube 40 are improved.

Next, a cooling device according to a fifth embodiment of the present disclosure will be described. Note that in the cooling device according to the fifth embodiment, a main part has a same configuration as the main parts of the cooling devices according to the first to fourth embodiments, and therefore, same components as the components of the cooling devices according to the first to fourth embodiments will be described by using the same reference signs. Note that FIG. 10 is a front view of a part of a condensation tube provided in the cooling device according to the fifth embodiment of the present disclosure.

Figure 10:
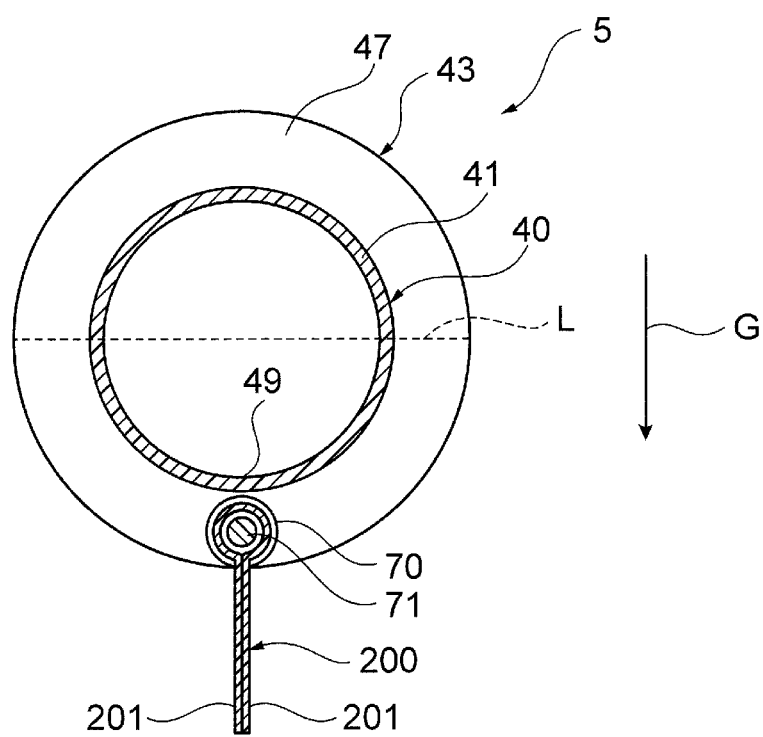
FIG. 10 is a front view of a part of a condensation tube provided in a cooling device according to a fifth embodiment of the present disclosure.

In the cooling device 4 according to the fourth embodiment, the porous member 200 sandwiched by the wire member 71 and the depression portion 70 has the two extension portions 201 extended along the gravity direction G, and the two extension portions 201 are disposed at the predetermined interval, whereas as illustrated in FIG. 10, in a cooling device 5 according to the fifth embodiment, two extension portions 201 extend in a state in direct contact with each other without a predetermined interval being provided. Since the two extension portions 201 are in the state in direct contact with each other, an outer peripheral surface of a wire member 71 is more reliably covered with the porous member 200. In the cooling device 5, the two entire extension portions 201 are in the state in direct contact with each other.

It is possible to perform mounting of the porous member 200 to the fin 47 in the cooling device 5 by a similar method to the method in the cooling device 4 according to the fourth embodiment.

Since holding characteristics of the porous member 200 to the primary refrigerant 20 in the liquid phase is reduced because the two extension portions 201 are in the state in direct contact with each other, the primary refrigerant 20 in the liquid phase is more smoothly removed from an outer surface 41 of a condensation tube 40.

Figure 11A:
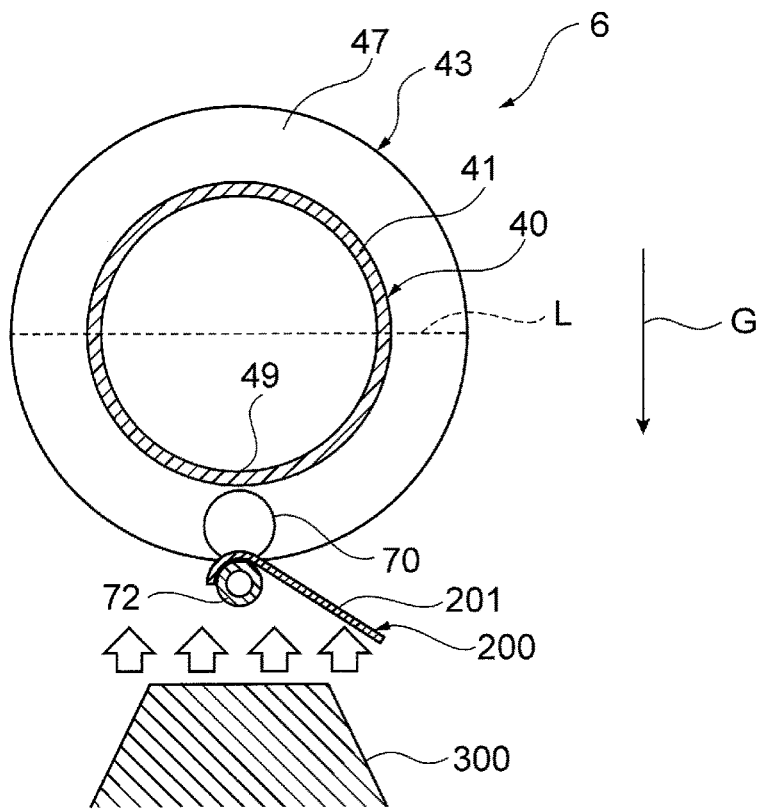
FIG. 11A is an explanatory view in front view before mounting a porous member to a condensation tube outer surface area increasing portion provided in a cooling device according to a sixth embodiment of the present disclosure and FIG. 11B is an explanatory view in front view after mounting the porous member to the condensation tube outer surface area increasing portion provided in the cooling device according to the sixth embodiment of the present disclosure.

Next, a cooling device according to a sixth embodiment of the present disclosure will be described. Note that in the cooling device according to the sixth embodiment, a main part has a same configuration as the main parts of the cooling devices according to the first to fifth embodiments, and therefore, same components as the components of the cooling devices according to the first to fifth embodiments will be described by using the same reference signs. Note that FIG. 11A is an explanatory view in front view before mounting a porous member to a condensation tube outer surface area increasing portion provided in the cooling device according to the sixth embodiment of the present disclosure, and FIG. 11B is an explanatory view in front view after mounting the porous member to the condensation tube outer surface area increasing portion provided in the cooling device according to the sixth embodiment of the present disclosure.

Figure 11B:
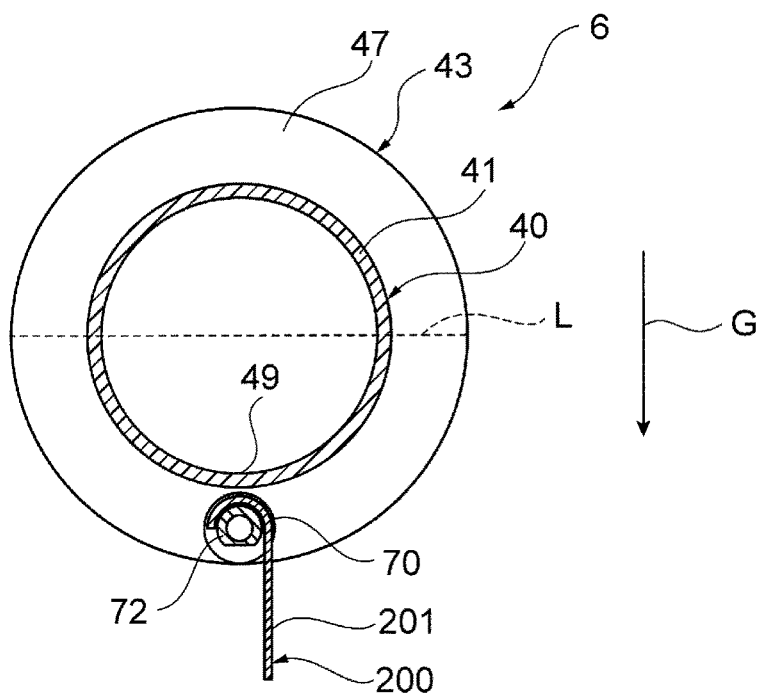

In the cooling device 4 according to the fourth embodiment, the porous member 200 is sandwiched by the wire member 71 inserted in the depression portion 70 and the depression portion 70, but as illustrated in FIG. 11B, in a cooling device 6 according to the sixth embodiment, a porous member 200 is sandwiched by a tube member 72 inserted into a depression portion 70 in a state of being compressed in a radial direction, and the depression portion 70. The porous member 200 is sandwiched by the compressed tube member 72 and the depression portion 70, and thereby the porous member 200 is mounted to a fin 47 that is a condensation tube outer surface area increasing portion 43.

In the cooling device 6, one end portion of the sheet-shaped porous member 200 is mounted to the fin 47, and the porous member 200 is sandwiched by the tube member 72 compressed in a radial direction and the depression portion 70 at the one end portion of the porous member 200. Accordingly, in the cooling device 6, a partial region of an outer peripheral surface of the tube member 72 is in contact with the porous member 200. Since the porous member 200 is sandwiched by the tube member 72 and the depression portion 70 at the one end portion, the porous member 200 has one extension portion 201 extended along a gravity direction G.

The depression portion 70 is provided at a position corresponding to a bottom portion 49 of a condensation tube 40. A shape in front view of the depression portion 70 is not specially limited, but is substantially circular in the cooling device 6. The shape in front view of the tube member 72 is not specially limited, but is substantially circular in the cooling device 6. As the tube member 72, it is possible to cite, for example, a metal wire such as a copper wire.

Next, an example of a method for mounting the porous member 200 to the fin 47 in the cooling device 6 will be described. As illustrated in FIG. 11A, the cut-hole-shaped depression portion 70 is firstly formed in a part at a lower side in a gravity direction, of the fin 47, and one end portion of the sheet-shaped porous member 200 is disposed at an inlet of the depression portion 70 from the lower side in the gravity direction. Next, the tube member 72 having a substantially equal diameter to a diameter of the depression portion 70 is prepared, and the tube member 72 is disposed at one end portion of the porous member 200 from the lower side in the gravity direction. Next, a compression jig 300 is caused to abut on the tube member 72 from the lower side in the gravity direction. Next, the compression jig 300 is moved to an upper side in the gravity direction, and the tube member 72 is press-fitted into the depression portion 70 while being compressed in a radial direction. At this time, a shape in the radial direction, of the tube member 72 deforms to correspond to a shape of the depression portion 70, whereby the porous member 200 is brought into a state sandwiched by the tube member 72 and the depression portion 70, and can be mounted to the fin 47, as illustrated in FIG. 11B. As a method for forming the depression portion 70 in the cut-hole shape, it is possible to cite electrical-discharge machining, for example.

In the cooling device 6, a primary refrigerant 20 in a liquid phase held by an outer surface 41 of the condensation tube 40 moves to the porous member 200 from the outer surface 41 of the condensation tube 40 by a capillary force of the porous member 200, and therefore the primary refrigerant 20 in the liquid phase is smoothly removed from the outer surface 41 of the condensation tube 40. The primary refrigerant 20 in the liquid phase flows downward in the gravity direction in the extension portion 201 by an action of gravity, and can smoothly return to the primary refrigerant 20 in the liquid phase stored in an inside of a container 10 from the porous member 200. Accordingly, in the cooling device 6, it is possible to prevent the primary refrigerant 20 in the liquid phase from being held by the outer surface 41 of the condensation tube 40 and a condensation tube outer surface area increasing portion 43, and therefore, heat exchange characteristics between the primary refrigerant in a gaseous phase and a secondary refrigerant 30 via the condensation tube 40 are improved. Further, in the cooling device 6, the porous member 200 is sandwiched by the compressed tube member 72 and the depression portion 70, and therefore, connection strength between the porous member 200 and the condensation tube outer surface area increasing portion 43 is improved.

Next, a cooling device according to a seventh embodiment of the present disclosure will be described. Note that in the cooling device according to the seventh embodiment, a main part has a same configuration as the main parts of the cooling devices according to the first to sixth embodiments, and therefore, same components as the components of the cooling devices according to the first to sixth embodiments will be described by using the same reference signs. Note that FIG. 12A is an explanatory view in front view before mounting a porous member to a condensation tube outer surface area increasing portion provided in the cooling device according to the seventh embodiment of the present disclosure, and FIG. 12B is an explanatory view in front view after mounting the porous member to the condensation tube outer surface area increasing portion provided in the cooling device according to the seventh embodiment of the present disclosure.

Figure 12A:
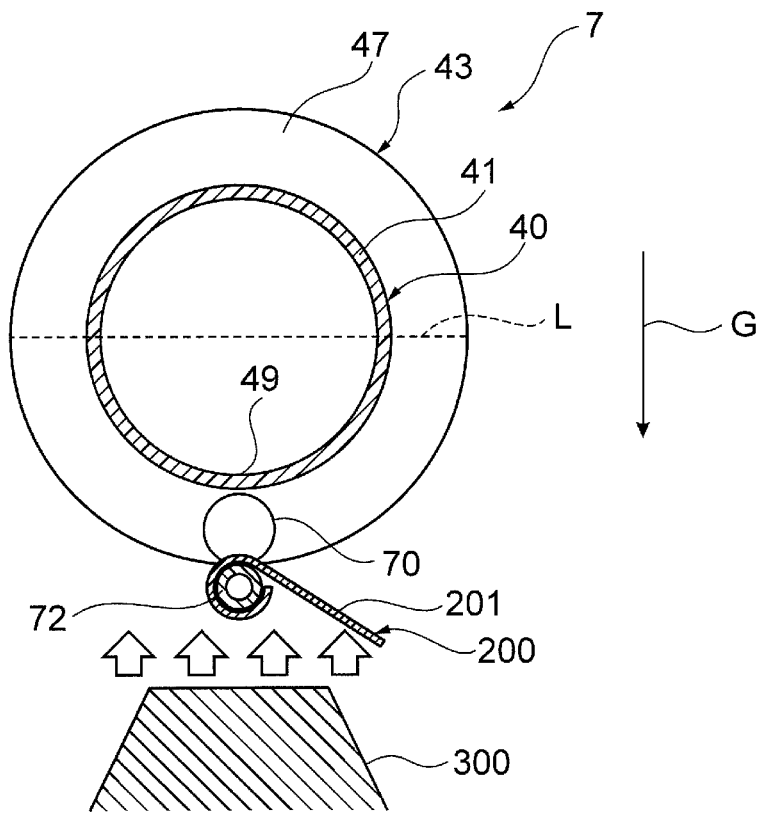
FIG. 12A is an explanatory view in front view before mounting a porous member to a condensation tube outer surface area increasing portion provided in a cooling device according to a seventh embodiment of the present disclosure.
Figure 12B:
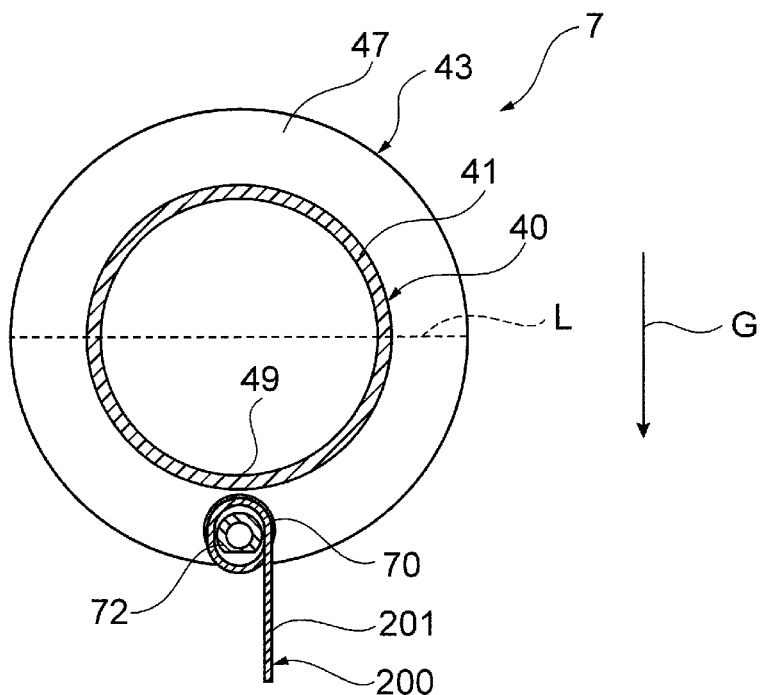
FIG. 12B is an explanatory view in front view after mounting the porous member to the condensation tube outer surface area increasing portion provided in the cooling device according to the seventh embodiment of the present disclosure.

In the cooling device 6 according to the sixth embodiment, the one end portion of the sheet-shaped porous member 200 is mounted to the fin 47, and the partial region of the outer peripheral surface of the tube member 72 is in contact with the porous member 200, but as illustrated in FIG. 12B, in a cooling device 7 according to the seventh embodiment, one end portion of a sheet-shaped porous member 200 and a vicinity of the one end portion are mounted to a fin 47, and accordingly, an entire outer peripheral surface of the tube member 72 is in contact with the porous member 200.

The outer peripheral surface of the tube member 72 is in a state wrapped with the porous member 200. Accordingly, the outer peripheral surface of the tube member 72 is covered with the porous member 200.

A method for mounting the porous member 200 to a fin 47 in the cooling device 7, as illustrated in FIG. 12A, is such that a depression portion 70 in a cut-hole shape is formed in a part at a lower side in a gravity direction, of the fin 47, and a tube member 72 having a substantially equal diameter to a diameter of the depression portion 70 is prepared. Next, the one end portion of the sheet-shaped porous member 200 and the vicinity of the one end portion are wound around the outer peripheral surface of the tube member 72, and the tube member 72 is disposed at an inlet of the depression portion 70 from the lower side in the gravity direction. Next, a compression jig 300 is caused to abut on the tube member 72 on which the porous member 200 is wound from the lower side in the gravity direction. Next, the compression jig 300 is moved to an upper side in the gravity direction, and the tube member 72 on which the porous member 200 is wound is press-fitted to the depression portion 70 while being compressed in the radial direction. At this time, a shape in the radial direction of the tube member 72 deforms to correspond to a shape of the depression portion 70, whereby the porous member 200 is brought into a state sandwiched by the tube member 72 and the depression portion 70, and can be mounted to the fin 47, as illustrated in FIG. 12B.

In the cooling device 7, a primary refrigerant 20 in a liquid phase held by an outer surface 41 of a condensation tube 40 moves to the porous member 200 from the outer surface 41 of the condensation tube 40 by a capillary force of the porous member 200, and therefore the primary refrigerant 20 in the liquid phase is smoothly removed from the outer surface 41 of the condensation tube 40. Further, in the cooling device 7, the primary refrigerant 20 in the liquid phase can flow to an extension portion 201 of the porous member 200 from the entire outer peripheral surface of the tube member 72 when the primary refrigerant 20 in the liquid phase flows downward in the gravity direction in the extension portion 201 by an action of gravity, and therefore the primary refrigerant 20 in the liquid phase can more smoothly return to the primary refrigerant 20 in the liquid phase stored in an inside of a container 10 from the porous member 200. Further, the outer peripheral surface of the compressed tube member 72 is in the state wrapped with the porous member 200, and therefore connection strength between the porous member 200 and the condensation tube outer surface area increasing portion 43 is further improved.

Next, a cooling device according to an eighth embodiment of the present disclosure will be described. Note that in the cooling device according to the eighth embodiment, a main part has a same configuration as the main parts of the cooling devices according to the first to seventh embodiments, and therefore, same components as the components of the cooling devices according to the first to seventh embodiments will be described by using the same reference signs. Note that FIG. 13 is a front view of a part of a condensation tube provided in the cooling device according to the eighth embodiment of the present disclosure.

In the cooling device 2 according to the second embodiment, the single notch 47" is formed along the gravity direction G, in the part at the lower side in the gravity direction, of the fin 47, the single porous member 200 is inserted into the single notch 47", and thereby the porous member 200 is mounted to a condensation tube outer surface area increasing portion 43. In other words, in the cooling device 2, the single porous member 200 is mounted to the condensation tube outer surface area increasing portion 43, but as illustrated in FIG. 13, in a cooling device 8 according to the eighth embodiment, two notches 47" are formed, one porous member 200 is inserted into each of the two notches 47", and the porous members 200 are mounted to the condensation tube outer surface area increasing portion 43. Accordingly, a plurality of porous members 200 (two porous members 200) are mounted to the condensation tube outer surface area increasing portion 43.

Figure 13:
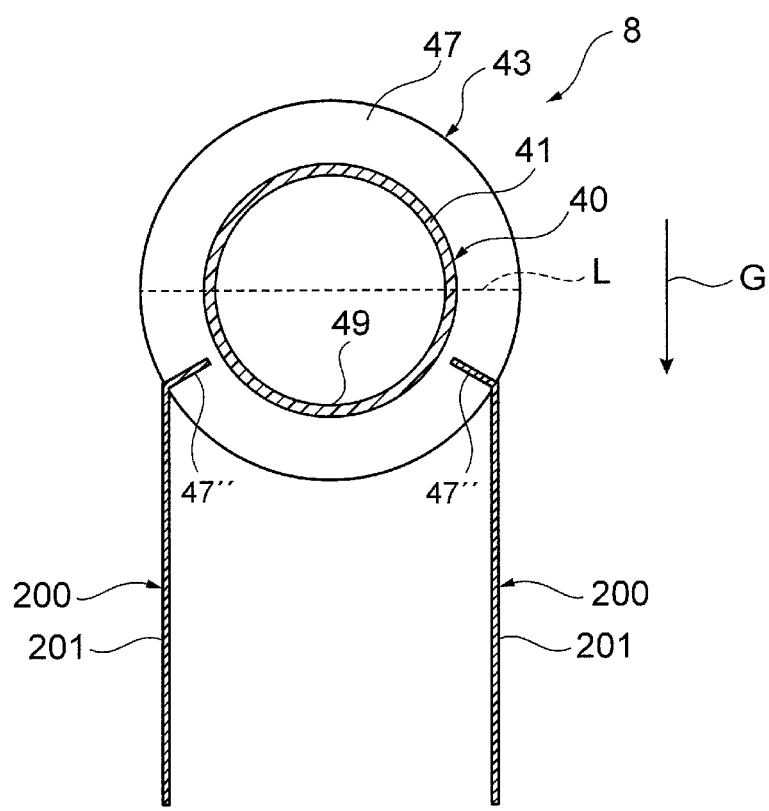
FIG. 13 is a front view of a part of a condensation tube provided in a cooling device according to an eighth embodiment of the present disclosure.

Further, in the cooling device 2 according to the second embodiment, the porous member 200 is provided at the bottom portion 49 of the condensation tube 40, but as illustrated in FIG. 13, in the cooling device 8, the porous members 200 are provided at a lower side in a gravity direction from a center line L, but at an upper side in the gravity direction from a bottom portion 49 of the condensation tube 40.

In the cooling device 8, the two porous members 200 and 200 are separate bodies, and are not in contact with each other. Further, the two porous members 200 and 200 are mounted to the fin 47 at approximately a same height and at positions that are approximately symmetrical laterally.

In the cooling device 8, the plurality of porous members 200 are mounted to the condensation tube outer surface area increasing portion 43, and thereby the primary refrigerant 20 in the liquid phase is more smoothly removed from the outer surface 41 of the condensation tube 40. Further, in the cooling device 8, a primary refrigerant 20 in a liquid phase can flow to extension portions 201 of the plurality of porous members 200 when the primary refrigerant 20 in the liquid phase flows downward in the gravity direction in the extension portions 201 by an action of gravity, and therefore, the primary refrigerant 20 in the liquid phase can more smoothly return to the primary refrigerant 20 in the liquid phase stored in an inside of a container 10 from porous members 200.

Next, concerning the cooling device of the present disclosure, other embodiments will be described. In the above described first to seventh embodiments, the porous members are provided at the bottom portions of the condensation tubes, but instead of them, the porous member may be provided in a part other than the bottom portion of the condensation tube, and, for example, the porous member may be provided in a part from the bottom portion to a side surface portion of the condensation tube. Further, in the first embodiment, the shape of the section of the porous member is a substantially T-shape, and the extension portion of the porous member is extended along the gravity direction from the center portion in the width direction, of the base portion of the porous member, but instead of this, the extension portion of the porous member may extend along the gravity direction from the end portion in the width direction of the base portion, and the porous member does not have to have the extension portion extending along the gravity direction.

Since the cooling device of the present disclosure can reduce heat resistance by improving the heat exchange action of the condensation tubes, the cooling device of the present disclosure is usable in a wide range of fields, and has high utility value in a field of cooling electronic components that have a large amount of heat generation and are mounted on a circuit board, such as a central processing unit (CPU), for example.

What is claimed is:

1. A cooling device comprising:
   a container to which at least one heating element is thermally connected;
   a primary refrigerant sealed in an inside of the container;
   a plurality of condensation tubes through which a secondary refrigerant flows, and which penetrates through a gaseous phase portion in the inside of the container, wherein the plurality of condensation tubes comprises a condensation tube; and
   a plurality of porous members provided at outer surfaces of the plurality of condensation tubes, wherein the plurality of porous members comprises a porous member, and wherein each of the plurality of condensation tubes is provided with a respective one of the plurality of porous members.

2. The cooling device according to claim 1, wherein a condensation tube outer surface area increasing portion configured to increase a contact area with the primary refrigerant in a gaseous phase is formed on the outer surface of the condensation tube.

3. The cooling device according to claim 1, wherein the porous member is provided at a lower side in a gravity direction from a center line in an orthogonal direction to the gravity direction in a section in a width direction of the condensation tube, of the outer surface of the condensation tube.

4. The cooling device according to claim 1, wherein the porous member is provided at a bottom portion of the condensation tube that faces a liquid level of the primary refrigerant in a liquid phase stored in the inside of the container.

5. The cooling device according to claim 1, wherein the porous member includes an extension portion extended along a gravity direction.

6. The cooling device according to claim 1, wherein the porous member is a sheet-shaped member.

7. The cooling device according to claim 1, wherein the porous member is a metal mesh.

8. The cooling device according to claim 1, wherein the porous member is in contact with the outer surface of the condensation tube.

9. The cooling device according to claim 1, wherein the porous member extends along a longitudinal direction of the condensation tube.

10. The cooling device according to claim 2, wherein the condensation tube outer surface area increasing portion is a plurality of fins.

11. The cooling device according to claim 1, wherein a condensation tube inner surface area increasing portion configured to increase a contact area with the secondary refrigerant is formed on an inner surface of the condensation tube.

12. The cooling device according to claim 1, wherein a plurality of the condensation tubes each provided with the porous member are disposed in parallel.

13. The cooling device according to claim 1, wherein a plurality of the condensation tubes each provided with the porous member are disposed in layers.

14. The cooling device according to claim 1, wherein a secondary refrigerant storing block in which the secondary refrigerant is stored is further provided in the condensation tube, and the secondary refrigerant storing block is thermally connected to the container.

15. The cooling device according to claim 1, wherein the heating element is thermally connected to a part where the primary refrigerant in a liquid phase exists or a vicinity of the part where the primary refrigerant in the liquid phase exists, on an outer surface of the container.

16. The cooling device according to claim 1, wherein a container inner surface area increasing portion configured to increase a contact area with the primary refrigerant in a liquid phase is formed on an inner surface of the container to which the heating element is thermally connected.

17. The cooling device according to claim 16, wherein the container inner surface area increasing portion is immersed in the primary refrigerant in the liquid phase.

18. The cooling device according to claim 16, wherein the container inner surface area increasing portion is a plate-shaped fin, a pin fin and/or a dent.

19. The cooling device according to claim 16, wherein the container inner surface area increasing portion includes a thermal conductive member.

20. The cooling device according to claim 19, wherein the thermal conductive member is a metal member or a carbon member.

21. The cooling device according to claim 16, wherein at least a part of the container inner surface area increasing portion is a sintered body of a thermal conductive material or an aggregate of a particulate thermal conductive material.

22. The cooling device according to claim 21, wherein the sintered body of the thermal conductive material is a metal sintered body, and the metal sintered body is a sintered body of at least one kind of metal material selected from a group comprising metal powder, metal fiber, metal mesh, metal braid and metal foil.

23. The cooling device according to claim 21, wherein the aggregate of the particulate thermal conductive material is an aggregate of carbon particles.

24. A cooling system in which a cooling device comprising a container to which at least one heating element is thermally connected, a primary refrigerant sealed in an inside of the container, a condensation tube through which a secondary refrigerant flows, and which penetrates through a gaseous phase portion in the inside of the container, and a porous member provided at an outer surface of the condensation tube, and a secondary refrigerant cooling portion to which the condensation tube extending from the cooling device is connected are used, and the secondary refrigerant circulates in the cooling device and the secondary refrigerant cooling portion, wherein
   in the inside of the container thermally connected to the heating element, the primary refrigerant receiving heat from the heating element changes in phase to a gaseous phase from a liquid phase, the primary refrigerant in the gaseous phase changes in phase to a liquid phase from the gaseous phase by a heat exchange action of the condensation tube, whereby heat is transferred to the secondary refrigerant flowing through the condensation tube from the primary refrigerant, and the secondary refrigerant to which the heat is transferred flows through the condensation tube to the secondary refrigerant cooling portion to be cooled to a predetermined temperature, and the secondary refrigerant cooled in the secondary refrigerant cooling portion flows through the condensation tube to return to the cooling device.

* * * * *